United States Patent
Ema et al.

(10) Patent No.: US 7,414,292 B2
(45) Date of Patent: Aug. 19, 2008

(54) SEMICONDUCTOR DEVICE AND ITS MANUFACTURING METHOD

(75) Inventors: Taiji Ema, Kawasaki (JP); Hedeyuki Kojima, Kawasaki (JP); Toru Anezaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/153,752

(22) Filed: Jun. 16, 2005

(65) Prior Publication Data

US 2005/0227440 A1  Oct. 13, 2005

Related U.S. Application Data

(63) Continuation of application No. PCT/JP03/07384, filed on Jun. 10, 2003.

(51) Int. Cl.
  *H01L 29/72* (2006.01)
(52) U.S. Cl. .................. 257/369; 257/392; 257/401; 257/408; 257/499
(58) Field of Classification Search .................. 257/369, 257/392, 401, 408, 499
  See application file for complete search history.

(56) References Cited

U.S. PATENT DOCUMENTS 5,304,502 A * 4/1994 Hanagasaki ............... 438/210
6,436,747 B1 * 8/2002 Segawa et al. ............. 438/197

FOREIGN PATENT DOCUMENTS

| JP | 2-128465 | 5/1990 |
|---|---|---|
| JP | 3-18035 | 1/1991 |
| JP | 7-249762 | 9/1995 |
| JP | 9-135029 | 5/1997 |
| JP | 11-74353 | 3/1999 |
| JP | 11-87706 | 3/1999 |
| JP | 2000-31295 | 1/2000 |
| JP | 2000-68388 | 3/2000 |
| JP | 2000-164727 | 6/2000 |
| JP | 2000-198523 | 7/2000 |
| JP | 2000-243958 | 9/2000 |
| JP | 2001-7220 | 1/2001 |
| JP | 2001-257273 | 9/2001 |
| JP | 2002-280459 | 9/2002 |
| JP | 2002-353330 | 12/2002 |
| JP | 2003-77856 | 3/2003 |

* cited by examiner

*Primary Examiner*—Edward Wojciechowicz
(74) *Attorney, Agent, or Firm*—Westerman, Hattori, Daniels & Adrian, LLP.

(57) ABSTRACT

A semiconductor device manufacturing method includes, forming isolation region having an aspect ratio of 1 or more in a semiconductor substrate, forming a gate insulating film, forming a silicon gate electrode and a silicon resistive element, forming side wall spacers on the gate electrode, heavily doping a first active region with phosphorus and a second active region and the resistive element with p-type impurities by ion implantation, forming salicide block at 500° C. or lower, depositing a metal layer covering the salicide block, and selectively forming metal silicide layers. The method may further includes, forming a thick and a thin gate insulating films, and performing implantation of ions of a first conductivity type not penetrating the thick gate insulating film and oblique implantation of ions of the opposite conductivity type penetrating also the thick gate insulating film before the formation of side wall spacers.

5 Claims, 24 Drawing Sheets

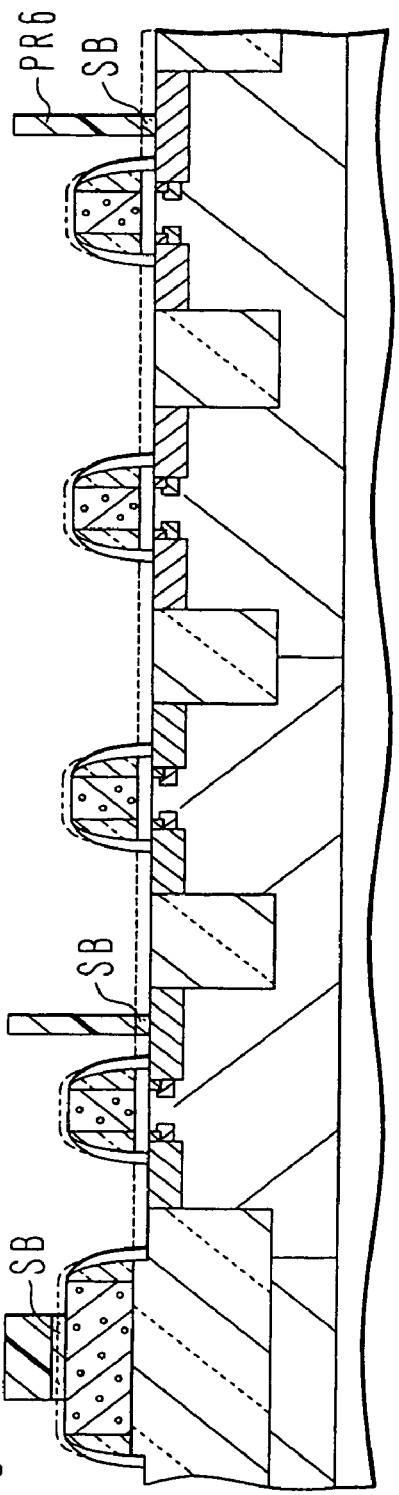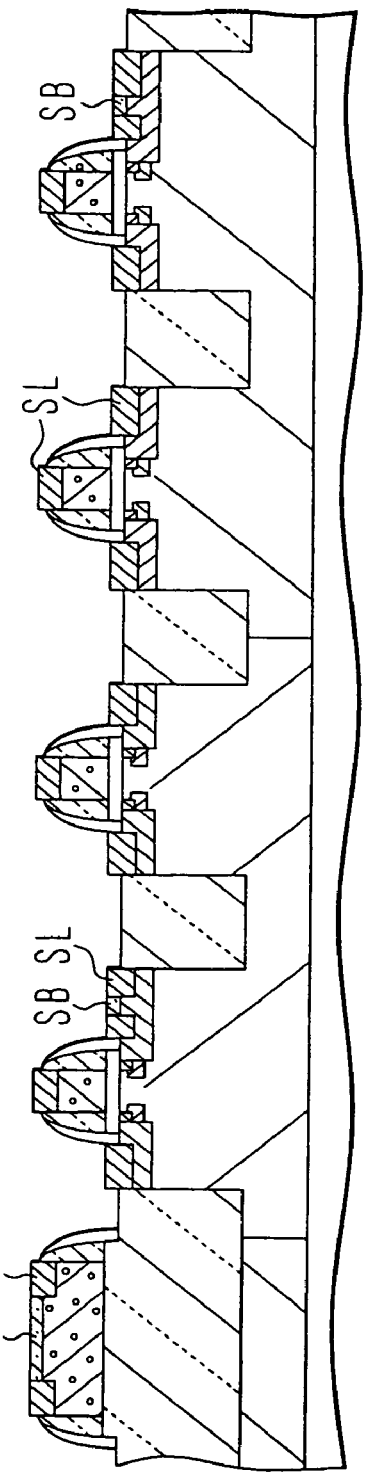

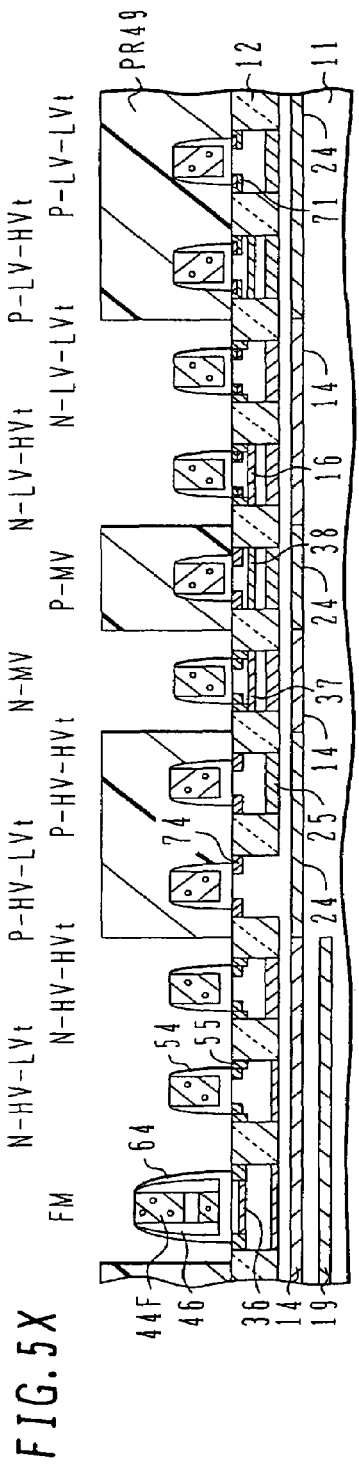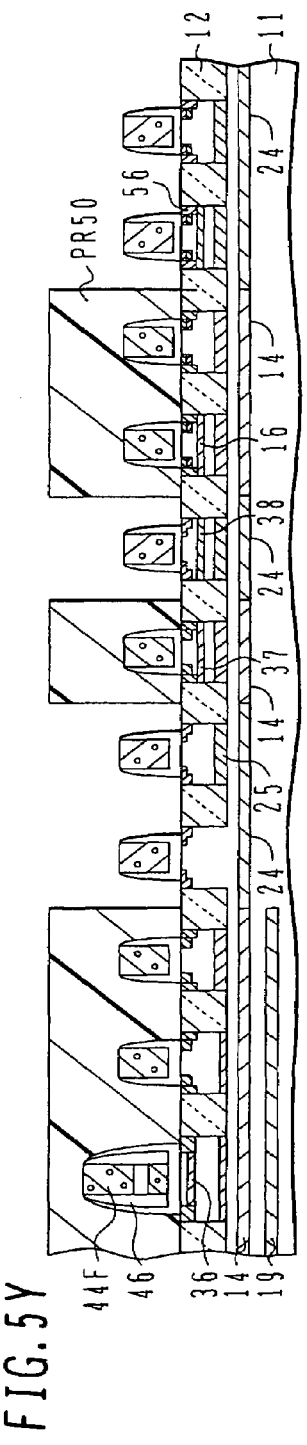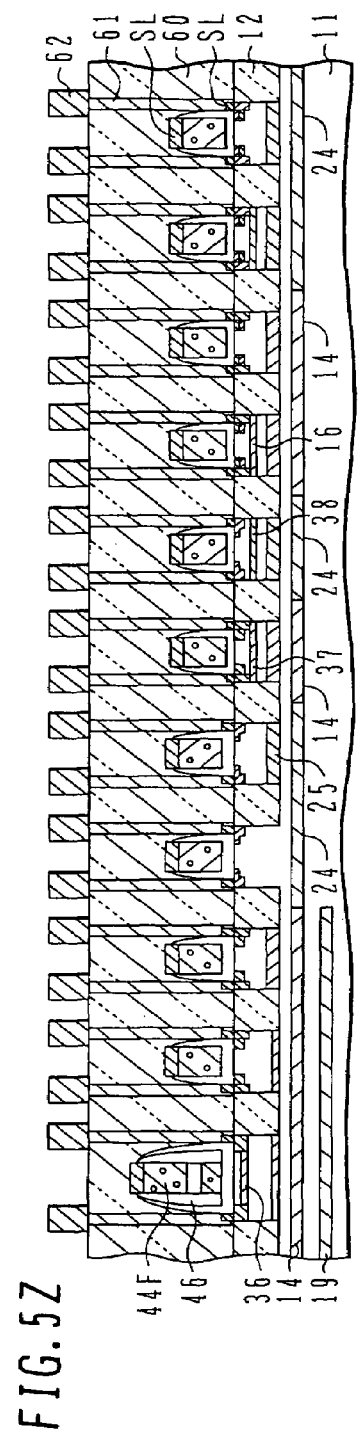

SEMICONDUCTOR DEVICE AND ITS MANUFACTURING METHOD

CROSS REFERENCE TO RELATED APPLICATION

This application is a continuation application of International Patent Application PCT/JP2003/007384 filed on Jun. 10, 2003, the entire contents of which are incorporated herein by reference.

BACKGROUND OF THE INVENTION

A) Field of the Invention

The present invention relates to a semiconductor device and its manufacture method, and more particularly to a semiconductor device having a plurality of semiconductor elements such as micro transistors and resistors or a plurality of transistors operating at different voltages, a semiconductor device having transistors with improved breakdown voltages, and their manufacture methods.

B) Description of the Related Art

As the integration degree of semiconductor integrated circuit devices (IC) is improved, transistors as IC constituent elements are made very fine. The performance of logic semiconductor elements has improved considerably and many functions are fabricated on the same chip. For example, high density static random access memories (SRAM) and ultra high speed input/output circuits are mounted on the same chip as that of logic circuits.

For example, SRAM constitutes one memory cell by six transistors: two n-channel driver transistors, two p-channel load transistors, and two n-channel transfer transistors. As compared to a dynamic RAM (DRAM) constituting one memory cell by one transistor and one capacitor, although the number of constituent elements is large, the refresh operation is unnecessary. A shallow trench isolation (STI) is widely used as the isolation region of a circuit accommodating a number of semiconductor elements such as high density SRAMs at a high density. Since STI has no bird's beaks as in local oxidation of silicon (LOCOS), an area usage factor can be improved and a surface with good planarization can be obtained.

In order to reduce parasitic resistance of a resistor, salicide techniques are widely used which form a metal silicide layer on source/drain regions and a gate electrode in a self alignment manner.

Japanese Patent Laid-open Publication No. 2000-198523 discloses an SRAM utilizing STI and salicide techniques. First side wall spacers are formed on the side walls of a gate electrode, high concentration ion implantation is performed for the source/drain regions and gate electrode, and after second side wall spacers are formed, salicidation is conducted over the whole substrate surface. By setting a gate electrode side end portion of the silicide layers on the source/drain regions, away from the junction, leak current can be reduced. Circuit elements other than SRAM are not disclosed.

If transistors and other elements are integrated by independent processes, the manufacture processes become complicated and a yield lowers. It is desired to make a plurality of elements share the same process and simplify the manufacture processes as much as possible. Depending upon the circuit to be fabricated, the other element to be fabricated by the same process is a capacitor in one case and a resistor in another case. If the resistor is to be formed, it is desired that the resistance value is a desired value. If the resistance value is too high or low, this is not appropriate in many cases.

Japanese Patent Laid-open Publication No. 2000-31295 discloses a semiconductor integrated circuit device in which element isolation is performed by STI, and analog resistors in an analog-digital conversion circuit are integrated with MOS transistors with silicide layers. This Publication discloses both an analog resistor made of a diffusion layer in a silicon substrate and an analog resistor made of polysilicon on an isolation region.

A resistor region is formed independently from a transistor in order to set an optimum value of an analog resistor having several tens $\Omega/\square$ to several hundreds $\Omega/\square$. When side wall spacers are formed, a resist mask is formed on the resistor region to leave a salicide block layer made of the same layer as that of the side wall spacers. Connection regions on opposite sides of the resistor region is heavily doped with ions at the same time when high concentration regions of the transistor are formed. Thereafter, a salicidation process is performed for the whole substrate surface. Salicide layers are therefore formed on the source/drain regions and gate electrode of the transistor and on the connection regions on opposite sides of the resistor region.

Japanese Patent Laid-open Publication No. 2002-280459 discloses an integrated circuit device in which element isolation is performed by LOCOS, and transistors, capacitors and resistors are integrated. The gate electrode of a transistor and a lower electrode of a capacitor are formed at the same time by using a first polysilicon layer, and after a capacitor dielectric film is formed, an upper electrode of the capacitor and a resistor are formed by using a second polysilicon layer. The resistor is made to have a desired impurity concentration by separate ion implantation. In a salicidation process, salicide block layers are formed on the resistor and input/output transistors so as not to form silicide layers.

A desired value and precision of a resistor are decided by its use. A resistor for electrostatic discharge (ESD) protection is desired to be made of a diffusion resistor near a transistor to simplify its structure and process, although it does not require a high precision of the resistance value. An analog resistor for an input/output circuit is required to have a high precision. It is desired to have a resistance value of, e.g., about several tens $\Omega/\square$ to several hundreds $\Omega/\square$.

As a transistor becomes very fine, an operation voltage lowers, the gate insulating film becomes thin, and the gate length becomes short. The short channel effects appear such as punch-through current between the source/drain regions in an off-state of the transistor.

In order to prevent the short channel effects, the structure has been developed in which source/drain regions are formed by shallow extension regions on both sides of the gate electrode and high impurity concentration source/drain regions on both sides of the side wall spacers on the side walls of the gate electrode, and the extension regions are surrounded by opposite conductivity type pocket regions. The pocket region can be formed by ion implantation along a direction inclined from the substrate normal, the ion implantation having a longer implantation range than that of ion implantation for the extension regions.

In a system on-chip, there are strong needs for mixing a logical circuit operating at a low voltage with a different circuit such as a flash memory control circuit operating at a high voltage. In order to realize this, it is necessary to integrate the logical circuit of a low voltage operation and the flash memory control circuit of a high voltage operation on the same semiconductor substrate.

For example, integrated are a low voltage transistor at 1.2 V for a logical circuit and a high voltage transistor for a flash memory control circuit at 5 V during a reed operation and lower than 10 V during a write/erase operation. There are strong needs for further integrating middle voltage transistors at 2.5 V and 3.3 V for an input/output (I/O) circuit. The operation voltage of a low voltage transistor has a tendency that it lowers further in the future, and there is a possibility that 5 V, 1.8 V, 1.2 V and etc., are added to the operation voltage of I/O middle voltage transistors. However, only one operation voltage is often used for middle voltage transistors requested by particular customers.

It is necessary for a high voltage transistor to suppress hot electron effects and have a necessary breakdown voltage. For the structure suitable for the high voltage transistor, a gate insulating film is made thick, a gate length is elongated, lightly doped drain (LDD) regions are formed on both sides of the gate electrode, and high concentration source/drain regions are formed on both sides of the side wall spacers on side walls of the gate electrode.

Although the extension region is often called LDD region, in this specification, the region having the main object of forming a shallow junction is called extension region, whereas the region having the main object of improving a breakdown voltage is called LDD region. Although the LDD region is desired to have a low impurity concentration as this term explicitly indicates, the extension region is not required to have a low impurity concentration if the junction depth is shallow.

If an independent manufacture process matching the desired characteristics of each transistor is selected when a plurality kind of transistors are integrated, the number of processes increases and the manufacture processes become complicated, resulting in a lowered yield and a high manufacture cost. It is desired to manufacture a plurality kind of transistors by simplified processes.

Japanese Patent Laid-open Publication No. 2000-68388 discloses as prior art the fundamental manufacture method for a semiconductor integrated circuit device having CMOS transistors operating at 1.8 V and CMOS transistors operating at 3.3 V.

FIGS. 10A to 10D illustrate main processes of this fundamental manufacture method. A shallow trench isolation 102 is formed in a silicon substrate 101, and n-wells 103 and p-wells 104 are formed by ion implantation. After thin gate insulating films 105 and thick gate insulating films 106 are formed, a gate electrode layer is deposited and patterned to form gate electrodes 107.

As shown in FIG. 10A, by using a mask 112 opening the region of an n-channel MOS (NMOS) transistor operating at 1.8 V, n-type impurity, e.g., As$^+$ ions, are implanted in a vertical direction at a relatively high concentration to form n-type extension regions 114. By using the same mask 112, p-type impurity, e.g., BF$_2^+$ ions, are implanted obliquely to form p-type pocket regions 116 outside the n-type extension regions 114.

As shown in FIG. 10B, by using a mask 118 opening the region of a p-channel MOS (PMOS) transistor operating at 1.8 V, p-type impurity, e.g., BF$_2^+$ ions, are implanted in a vertical direction at a relatively high concentration to form p-type extension regions 120. By using the same mask 118, n-type impurity, e.g., As$^+$ ions, are implanted obliquely to form n-type pocket regions 122 outside the p-type extension regions 120.

As shown in FIG. 10C, by using a mask 124 opening the region of an NMOS transistor operating at 3.3 V, n-type impurity, e.g., P$^+$ ions, are implanted at a relatively low concentration to form n-type LDD regions 126 capable of suppressing hot carriers.

As shown in FIG. 10D, by using a mask 128 opening the region of a PMOS transistor operating at 3.3 V, p-type impurity, e.g., BF$_2^+$ ions, are implanted to form p-type LDD regions 130 capable of suppressing leak current.

The transistor operating at 3.3 V has a long gate length and the short channel effects do not appear. The pocket regions are therefore unnecessary. If pocket regions are formed in a PMOS transistor, junction leak current increases instead.

Thereafter, side wall spacers of silicon oxide are formed on the side walls of the gate electrodes, and n- and p-type impurity ions are implanted into the NMOS and PMOS regions at a high concentration to form high concentration source/drain regions. In this manner, a multi voltage CMOS circuit operating at 1.8 V and 3.3 V is formed.

Japanese Patent Laid-open Publication No. 2000-164727 discloses a simplified manufacture method for CMOS transistors of a low voltage operation for an internal circuit and CMOS transistors of a high breakdown voltage (corresponding to the above-described middle voltage) for an I/O block.

FIGS. 11A to 11D illustrate main processes of this simplified manufacture method. In a p-type silicon substrate 201, n-type wells 202 are selectively formed, and an isolation region 203 is formed by LOCOS oxidation. There are formed thick gate insulating films 205 of 20 nm thick for high voltage operation and thin gate insulating films 206 of 7 nm thick for low voltage operation. A polysilicon layer is deposited to a thickness of 200 nm to 300 nm and patterned to form gate electrodes 207 for low voltage operation with a gate length of 0.2 to 0.4 μm and for high voltage operation with a gate length of 0.5 to 0.8 μm.

As shown in FIG. 11A, by using a resist mask 208 covering a PMOS region for low voltage operation and an NMOS region for high voltage operation, p-type impurity, boron ions, are implanted into the PMOS region for low voltage operation and the NMOS region for high voltage operation, along eight directions inclined by 50 to 60 degrees from the substrate normal, under the conditions of an acceleration energy of 40 keV to 60 keV and a dose of $5\times10^{11}$ cm$^{-2}$ to $10\times10^{11}$ cm$^{-2}$. Regions 209a and 209b doped with ions of p-type impurity B are therefore formed.

As shown in FIG. 11B, by using the same mask 208, n-type impurity, P$^+$ ions, are implanted under the conditions of an acceleration energy of 10 keV to 30 keV and a dose of $2\times10^{13}$ cm$^{-2}$ to $5\times10^{13}$ cm$^{-2}$. In the NMOS region having the thin gate insulating film 206, n-type impurity P ions are implanted to form n-type extension regions 210a, and in the PMOS region having the thick gate insulating film 205, implanted P$^+$ ions remain in the gate insulating film and do not reach the silicon substrate. This conclusion is given in the above-cited Publication.

As shown in FIG. 11C, by using a resist mask 211 covering a low voltage NMOS region and a high voltage PMOS, n-type impurity, P$^+$ ions, are implanted into the low voltage PMOS region and the high voltage NMOS region, along eight directions inclined by 30 to 50 degrees from the substrate normal, under the conditions of an acceleration energy of 120 keV to 170 keV and a dose of $1\times10^{11}$ cm$^{-2}$ to $2\times10^{11}$ cm$^{-2}$, to form n-type regions 212a and 212b in the low voltage PMOS region and high voltage NMOS region.

By using the same mask 211, p-type impurity, B$^+$ ions, are implanted under the conditions of an acceleration energy of 5 keV to 8 keV and a dose of $1\times10^{13}$ cm$^{-2}$ to $5\times10^{13}$ cm$^{-2}$, to form extension regions 214 in the low voltage PMOS region having the thin gage insulating film 106. Under these conditions, implanted p-type impurity, B$^+$ ions, remain in the gate insulating film and do not reach the silicon substrate. This conclusion is given in the above-cited Publication.

As shown in FIG. 11D, after side wall spacers 215 are formed on the side walls of the gate electrodes 207, a resist mask 216 is formed covering the low voltage operation PMOS region and the high voltage operation PMOS region.

$As^+$ ions as the n-type impurity are implanted under the conditions of an acceleration energy of 20 keV to 40 keV and a dose of $2.5 \times 10^{15}$ cm$^{-2}$, to form high impurity concentration (n$^+$-type) source/drain regions 217a in the low voltage operation NMOS region and n$^+$-type source/drain regions 217b in the high voltage operation NMOS region.

Similarly, by using a resist mask covering the NMOS region, p-type impurity ions are implanted into the PMOS region for form high impurity concentration source/drain regions. For example, high impurity concentration (p$^+$ type) source/drain regions are formed by implanting $BF_2^+$ ions at an acceleration energy of 30 keV to 50 keV and a dose of $2 \times 10^{15}$ cm$^{-2}$ to $5 \times 10^{15}$ cm$^{-2}$.

The present inventors have found that the technologies described in Japanese Patent Laid-open Publication No. 2000-164727 cannot be reduced in practice as will be later described.

SUMMARY OF THE INVENTION

An object of this invention is to provide a semiconductor device manufacture method capable of forming transistors and resistors by simplified processes.

Another object of this invention is to provide an efficient manufacture method for a semiconductor device having a plurality kind of transistors.

Still another object of this invention is to provide a semiconductor device manufacture method capable of forming transistors and high precision resistors of polysilicon doped with p-type impurities.

Another object of this invention is to provide a semiconductor device manufacture method of manufacturing low voltage transistors with the suppressed short channel effects and high voltage transistors with the improved breakdown voltage.

Another object of this invention is to provide a semiconductor device having transistors and resistors having high reliability capable of being formed by simplified processes.

Another object of this invention is to provide a semiconductor device having transistors with excellent breakdown voltage.

According to one aspect of the present invention, there is provided a manufacture method for a semiconductor device comprising steps of: (a) forming an isolation trench in a semiconductor substrate, the isolation trench defining active regions and having a portion with an aspect ratio of 1 or larger; (b) embedding an insulator in the isolation trench to form an isolation region; (c) forming a gate electrode above the active region, with a gate insulating film being interposed therebetween; (d) forming side wall spacers on side walls of the gate electrode; (e) implanting phosphorus ions into the active region at a high impurity concentration by using the isolation region, the gate electrode and the side wall spacers as a mask, to form high concentration source/drain regions; (f) after the step (e), forming a salicide block layer on a whole surface of the semiconductor substrate at a temperature of 500° C. or lower; (g) patterning the salicide block layer to cover a portion of the high concentration source/drain regions with the salicide block layer; and (h) depositing a metal layer on the patterned salicide block layer and selectively forming a metal silicide layer by using the salicide block layer as a mask.

According to another aspect of the present invention, there is provided a manufacture method for a semiconductor device comprising steps of: (a) forming an isolation trench in a semiconductor substrate, the isolation trench defining first and second active regions and having a portion with an aspect ratio of 1 or larger; (b) embedding an insulator in the isolation trench to form an isolation region; (c) forming a gate insulating film on surfaces of the first and second active regions; (d) depositing a silicon layer not containing impurities on a whole surface of the semiconductor substrate, patterning the silicon layer to form gate electrodes and a resistor element on the isolation region; (e) forming side wall spacers on side walls of the gate electrodes; (f) implanting phosphorus ions into the first active region at a high impurity concentration by using the isolation region, the gate electrode and the side wall spacers as a mask, to form high concentration source/drain regions; (g) implanting p-type impurity ions into the second active region at a high impurity concentration by using the isolation region, the gate electrode and the side wall spacers as a mask, to form high concentration source/drain regions, and implanting the p-type impurity ions at the high concentration into the resistor element; (h) forming a salicide block layer on a whole surface of the semiconductor substrate at a temperature of 500° C. or lower; (i) patterning the salicide block layer to leave the salicide block layer covering a portion of the resistor element; and (h) depositing a metal layer covering the left salicide block layer and selectively forming a metal silicide layer by using the salicide block layer as a mask.

According to another aspect of the present invention, there is provided a semiconductor device comprising: a semiconductor substrate having a principal surface; an isolation trench formed on the principal surface of the semiconductor substrate, the isolation trench defining first and second active regions and having a portion with an aspect ratio of 1 or larger; an element separation region including a field region and made of an insulator buried in the isolation trench; a gate insulating film formed on surfaces of the first and second active regions; a first gate electrode formed on the gate insulating film, the first gate electrode traversing the first active region and containing phosphorus at a high concentration; a second gate electrode formed on the gate insulating film, the first gate electrode traversing the second active region and containing p-type impurities; a p-type resistor element formed on the field region and made of a same layer as a layer of the second gate electrode; a salicide block layer formed on a partial surface of the resistor element; side wall spacers formed on side walls of the first and second gate electrodes; first source/drain regions formed in the first active region outside the side wall spacers and containing phosphorus at a high concentration; second source/drain regions formed in the second active region outside the side wall spacers and containing p-type impurities; and a silicide layer formed on a surface of the resistor element excepting the salicide block layer, at least a partial surface of the first and second source/drain regions, and at least a partial surface of the first and second gate electrodes.

According to another aspect of the present invention, there is provided a manufacture method for a semiconductor device comprising steps of: (a) forming first and second active regions of a first conductivity type and third and fourth active regions of a second conductivity type in a semiconductor device; (b) forming a gate insulating film having a first thickness on the first and third active regions; (c) forming a gate insulating film having a second thickness on the second and fourth active regions, the second thickness being considerably thinner than the first thickness; (d) forming first to fourth gate electrodes on the gate insulating films in the first to fourth active regions and leaving the gate insulating films; (e) performing a first ion implantation of impurities of the first conductivity type into the first and fourth active regions under conditions that the impurities penetrate through the gate insulating film having the second thickness and do not penetrate through the gate insulating film having the first thickness; (f) performing a second ion implantation of impurities of the second conductivity type into the first and source active regions under conditions that the impurities penetrate through the gate insulating films; (g) performing a third ion implantation of impurities of the second conductivity type into the second and third active regions under conditions that the impurities penetrate through the gate insulating film having the second thickness and do not penetrate through the gate insulating film having the first thickness; (h) performing a fourth ion implantation of impurities of the first conductivity type into the second and third active regions under a condition that the impurities penetrate through the gate insulating films; (i) depositing an insulating layer on a whole surface of the semiconductor substrate, and anisotropically etching the insulating layer to form side wall spacers on side walls of the gate electrodes and remove exposed gate insulating films; (j) performing a fifth ion implantation of impurities of the second conductivity type into the first and second active regions, by using the side wall spacers as a mask; and (k) performing a sixth ion implantation of impurities of the first conductivity type into the third and fourth active regions, by using the side wall spacers as a mask.

According to another aspect of the present invention, there is provided a semiconductor device comprising: a semiconductor substrate; first and second active regions of a first conductivity type formed in the semiconductor substrate; third and fourth active regions of a second conductivity type formed in the semiconductor substrate; a gate insulating film having a first thickness formed in the first and third active regions; a gate insulating film having a second thickness formed in the second and fourth active regions, the second thickness being considerable thinner than the first thickness; first to fourth gate electrodes formed on the gate insulating films in the first to fourth active regions, respectively; side wall spacers of insulating material formed on side walls of the first to fourth gate electrodes; first and second source/drain regions having a high impurity concentration of the second conductivity type formed in the first and second active regions outside the side wall spacers; third and fourth source/drain regions having a high impurity concentration of the first conductivity type formed in the third and fourth active regions outside the side wall spacers; LDD regions of the second conductivity type continuous with the first source/drain regions formed in the first active region under the side wall spacers; extension regions of the first conductivity type continuous with the fourth source/drain regions formed in the fourth active region under the side wall spacers; and pocket regions of the second conductivity type formed surrounding the extension regions of the first conductivity type in the fourth active region, wherein the gate insulating films extend under the side wall spacers and do not extend above the source/drain regions having the high impurity concentration, and a second conductivity type impurity concentration distribution in the first active region under the side wall spacers on side walls of the first gate electrode and in the gate insulating film having the first thickness formed on the first active region is substantially equal to a second conductivity type impurity concentration distribution in the fourth active region under the side wall spacers on side walls of the fourth gate electrode and in the gate insulating film having the second thickness formed on the fourth active region.

According to another aspect of the present invention, there is provided a manufacture method for a semiconductor device comprising steps of: (a) forming a first active region of a first conductivity type in a semiconductor substrate; (b) forming a first gate insulating film on the first active region; (c) forming a first gate electrode on the first gate insulating film; (d) implanting impurity ions of a second conductivity type into the first active region along a plurality of directions tilled from a substrate normal, by using the first gate electrode as a mask; (e) depositing an insulating layer on a whole surface of the semiconductor substrate, and anisotropically etching the insulating layer to form side wall spacers on side walls of the first gate electrode; and (f) implanting impurity ions of the second conductivity type into the first active region at a high concentration, by using the first gate electrode and the side wall spacers as a mask.

According to another aspect of the present invention, there is provided a semiconductor device comprising: a semiconductor substrate; an active region of a first conductivity type defined in the semiconductor substrate; a gate insulating film formed on the active region; a gate electrode formed on the gate insulating film; insulating side wall spacers formed on side walls of the gate electrode; LDD regions formed extending in the active region from under an end portion of the gate electrode, and via an end of the gate electrode, to under the insulating side wall spacers, the LDD regions having a monotonously increasing concentration gradient of impurities of a second conductivity type along an in-plane direction, in an area from under an end portion of the gate electrode, and via an end of the gate electrode, to outside the gate electrode; and high concentration source/drain regions of the second conductivity type continuous with the LDD regions formed on the active regions outside the side wall spacers.

BRIEF DESCRIPTION OF THE DRAWINGS

FIGS. 3A to 3L are cross sectional views illustrating main manufacture processes for a semiconductor device having transistors and resistors according to an embodiment of the invention.

DESCRIPTION OF THE PREFERRED EMBODIMENTS

The present inventors are now under developments of a semiconductor device which mounts, on the same chip, low voltage transistors including SRAM, a flash memory, high voltage transistors for controlling the flash memory, middle voltage transistors for an ultra high speed input/output circuit, high precision resistors for an analog circuit, diffusion resistors for ESD protection, by photolithography of the 0.13 μm rule.

First, description will be made on the analysis, made by the present inventors, of the technologies disclosed in Japanese Patent Laid-open Publication No. 2000-164727.

Japanese Patent Laid-open Publication No. 2000-164727 concludes that even if phosphorus ($P^+$) ions are implanted into the gate insulating film having a thickness of 20 nm at an acceleration energy of 10 keV to 30 keV and a dose of $2\times10^{13}$ $cm^{-2}$ to $5\times10^{13}$ $cm^{-2}$, the implanted $P^+$ ions will not reach the silicon substrate.

Figure 12:
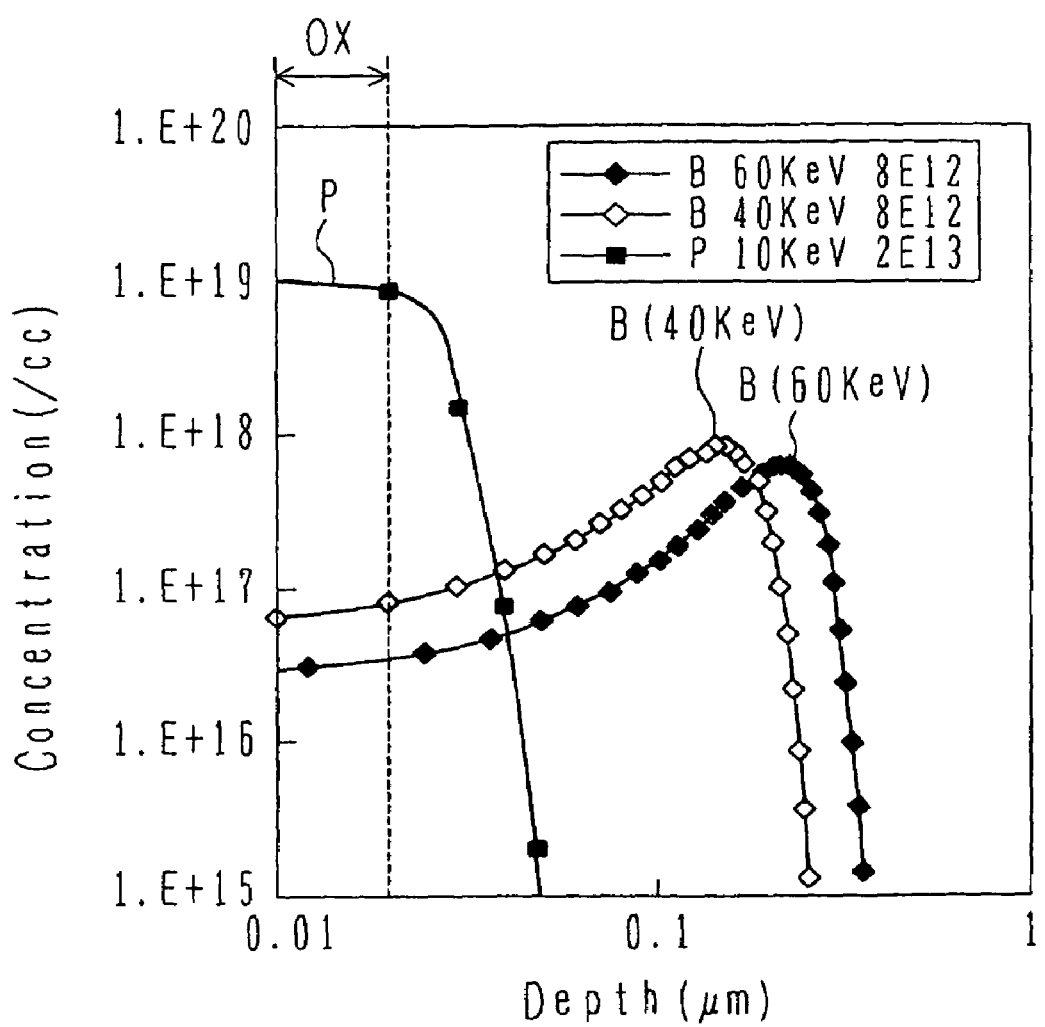
FIG. 12 is a graph showing an impurity concentration distribution in a semiconductor device formed by the processes shown in FIGS. 11A to 11D, the distribution being obtained by simulation made by the present inventors.

FIG. 12 is a graph showing an impurity concentration distribution immediately after ion implantation. A curve P indicates a simulation result of an impurity distribution of P ions implanted under the conditions of an acceleration energy of 10 keV and a dose of $2\times10^{13}$ $cm^{-2}$. A region of the thick gate insulating film is indicated by OX. As apparent from this graph, implanted P impurity ions are distributed at a high concentration even in the silicon substrate.

In the same region, $B^+$ ions are implanted eight times at an ion implantation angle of 50° to 60° at an acceleration energy of 40 keV to 60 keV and a dose of $5\times10^{11}$ $cm^{-2}$ to $10\times10^{11}$ $cm^{-2}$. The B distribution of this ion implantation was also obtained through simulation.

In FIG. 12, B distributions are shown for B ion implantation at an acceleration energy of 60 keV and a dose of $8\times10^{12}$ $cm^{-2}$, and for B ion implantation at an acceleration energy of 40 keV and a dose of $8\times10^{12}$ $cm^{-2}$.

As apparent from this graph, although B ion implantation forms a p-type impurity concentration distribution in the silicon substrate, an n-type impurity concentration region having a concentration higher by about two digits is formed in the surface area by P ion implantation. There are therefore no grounds to rely upon the conclusion made in the cited Publication that although implanted phosphorus ions are doped into the substrate in the low voltage NMOS region, they remain in the thick gate oxide film in the high voltage PMOS region and will not reach the silicon substrate.

Figure 11A:
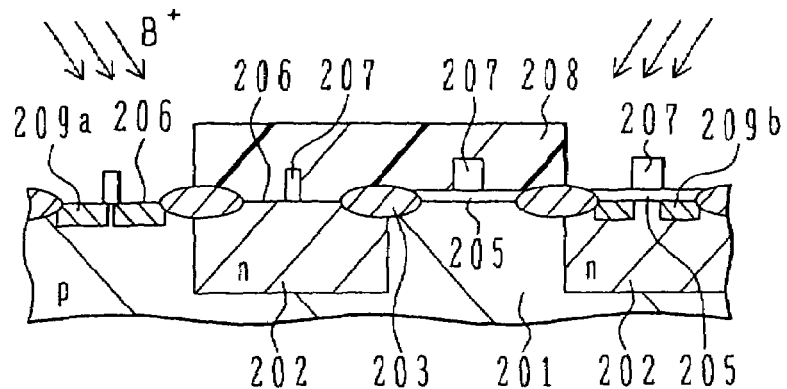
FIGS. 11A to 11D are cross sectional views of a semiconductor substrate illustrating main processes of a semiconductor device manufacture method disclosed in Japanese Patent Laid-open Publication No. 2000-164727.
Figure 11B:
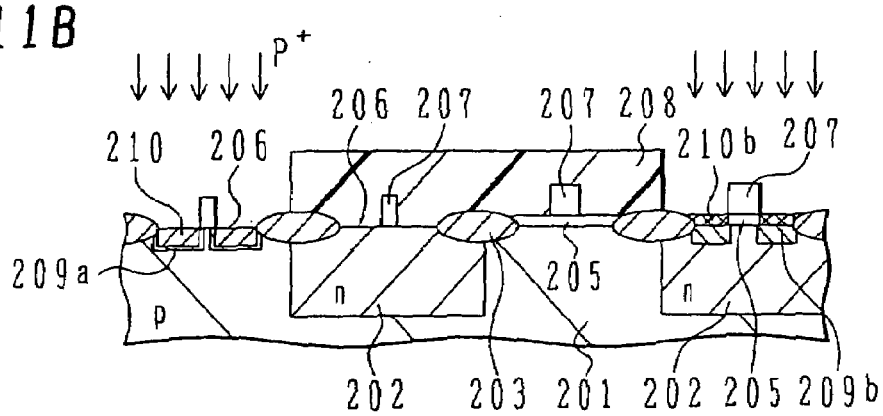
Figure 11C:
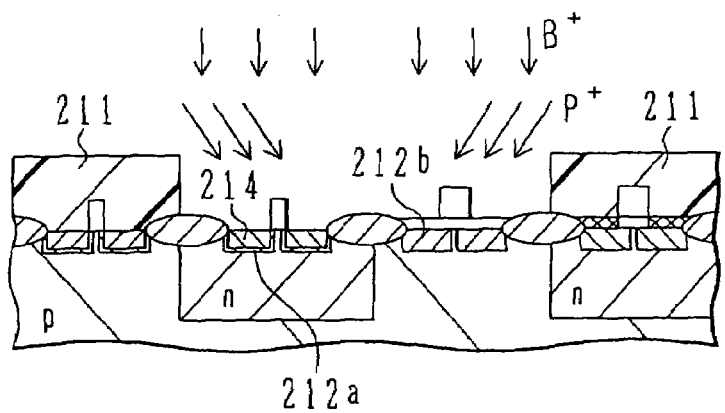
Figure 11D:
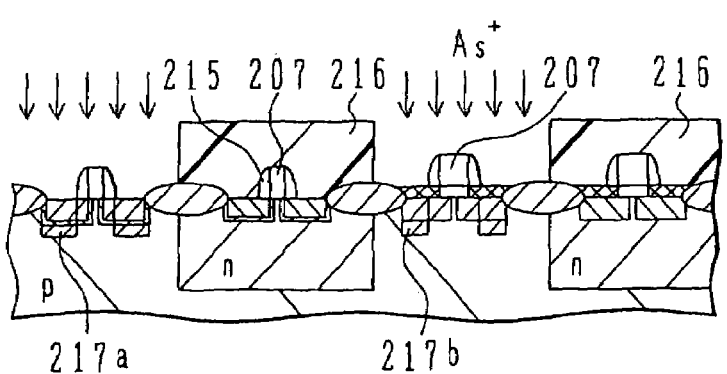

In the process shown in FIG. 11D, As (arsenic) ions are implanted via the gate insulating film to form the high concentration source/drain regions 217a and 217b. The acceleration energy of this ion implantation is required to be set high so that the source/drain regions 217b are formed via the thick gate insulating film. In this case, in the low voltage NMOS transistor region having the thin gate insulating film, the source/drain regions 217a are formed deeper. The short channel effects are likely to occur between deep source/drain regions.

Japanese Patent Laid-open Publication No. 2000-164727 has the object of suppressing an increase in off-leak of a transistor (short channel effects) and improving a hot carrier breakdown voltage. However, this Publication does not describe at all how this object can be achieved.

A resistance value of crystalline silicon lowers with the temperature and it is difficult to form a resistor having a high precision even in a temperature changing environment. A resistance value of p-type polysilicon has a minimum temperature change. It is preferable to form a high precision resistor by using p-type polysilicon.

Low voltage transistors used by a logical circuit, SRAM or the like are desired to be formed at as high an integration degree as possible. From the viewpoint of shortening a distance between elements, it is preferable to form a narrow element separation trench and form an element separation region by shallow trench isolation.

In semiconductor elements using a rule of 0.13 μm or shorter, an aspect ratio of 1 or higher is desired to be permitted for an STI trench. However, the trench portion having the aspect ratio of 1 or higher is difficult to be fully buried with a silicon oxide film deposited by thermal TEOS-CVD, and a void is formed. In order to bury the trench portion having the aspect ratio of 1 or higher, a silicon oxide film deposited by high density plasma (HDP) CVD can be used according to current technologies.

In order to reduce parasitic resistance of a transistor, the salicide structure is preferably used. For low voltage operation, it is preferable to form a transistor having a low threshold value Vt, and a dual gate structure is adopted in which the gate electrode of an NMOS transistor is made of n-type polysilicon and the gate electrode of a PMOS transistor is made of p-type polysilicon.

Next, description will be made on the preliminary experiments made by the present inventors on which the present invention is based.

Figure 1C:
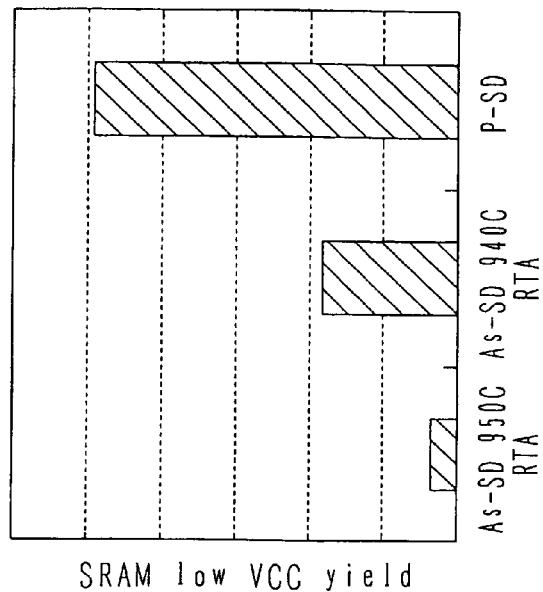
FIGS. 1A to 1C are an equivalent circuit diagram, a plan view and a graph showing a yield of SRAMs operating at a low voltage, illustrating preliminary experiments made by the present inventors.
Figure 1A:
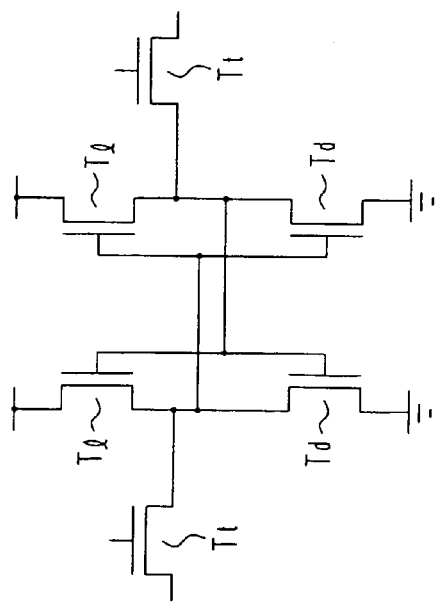

FIG. 1A is an equivalent circuit of an SRAM. Two drive transistors Td are n-channel MOS transistors and are serially connected to two p-channel load transistors TI to form inverter connections. Voltages at interconnects of the two inverter connections are output via two n-channel transfer MOS transistors Tt. An output voltage of one inverter connection is cross-wired to the gate electrodes of the other inverter connection.

Figure 1B:
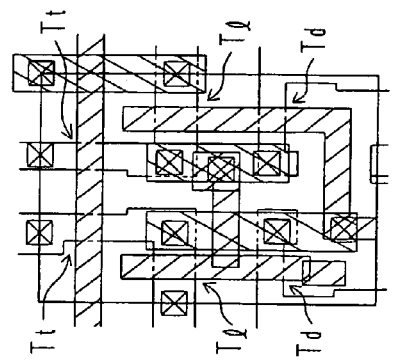

FIG. 1B is a plan view of a unit cell of an SRAM cell. In each transistor, a gate electrode (word line) is disposed above the active region, indicated by being hatched with left down oblique lines. Metal wirings formed above the gate electrodes constitute interconnects, indicated by being hatched with right down oblique lines. The isolation region between active regions was formed by STI.

The STI trench has a portion having the aspect ratio of 1 or higher, and this portion was buried with a silicon oxide film formed by HDP-CVD. After the gate electrodes are formed, side wall spacers were formed, and ion implantation was performed for high concentration source/drain regions of n-channel and p-channel transistors. For the high concentration source/drain regions of an n-channel MOS transistors, As ions were implanted, and thereafter a salicide process was performed over the whole substrate surface.

FIG. 1C is a graph showing a yield of SRAMs operating at a low voltage. The yield was extremely poor in the case of samples (As-SD, 950° C., RTA) formed by implanting As ions for the source/drain regions and performing rapid thermal annealing (RTA) at 950° C.

The defective samples were observed and crystal defects such as dislocation were found in the region indicated by bold lines in the equivalent circuit shown in FIG. 1A. Defects were formed in the n-channel transistors, and no defect was formed in the p-channel transistors.

Samples (As-SD, 940° C., RTA) with activation annealing of RTA at 940° C. had a fairly recovered yield. However, the absolute value of the yield is still very low and insufficient. Although the yield is expected to be improved at a lower annealing temperature, it takes a long time to perform the annealing process.

Samples (P-SD) were formed by forming high concentration source/drain regions by using P instead of As. The other conditions are the same as those of the samples (As-SD, 950° C., RTA). The samples (P-SD) showed the yield improved considerably and its absolute value was satisfactory.

In embedding an STI trench with a silicon oxide layer formed by HDP-CVD and forming a micro n-channel MOS transistor in the active region, it has been found that although the yield is very small if As ions are doped for forming the high concentration source/drain regions, the yield is improved considerably if P ions are doped.

The following facts may therefore be thought of. It is known that an HDP-CVD silicon oxide film imparts a strong stress. As As ions are implanted into silicon crystal, As having a large atom radius amorphousizes the silicon crystal. During the activation process, amorphousized crystal tends to recover. Since As and Si have different atom radii, crystal detects are likely to be formed.

The positions of Si atoms are likely shifted, particularly in silicon under a strong stress. As a number of detects are formed in the strong stress state, interstitial silicon atoms move easily so that defects are likely to be grown. If defects are grown by dislocation or the like, a leak path is formed and leak current flows along it.

In the state that the interconnection between the driver transistor Td and the load transistor Tl is at a high level, if leak current flows through the driver transistor Td, the potential at the interconnection is forced to lower from the high level to the low level. Although any malfunction will not occur if the load transistor Tl can maintain high the potential at the interconnection, the drive capability of a low voltage operation PMOS transistor is weak allowing transition from the high level to the low level.

The yield is improved considerably by forming the high concentration source/drain regions by P doping. This may be ascribed to that using P having a small atom radius prevents formation of crystal defects described above and growth of dislocation.

From this technical standpoint, the high concentration source/drain regions of an n-channel MOS transistor are formed by P doping, and an analog resistor is formed by a p-type polysilicon layer.

Figure 2A:
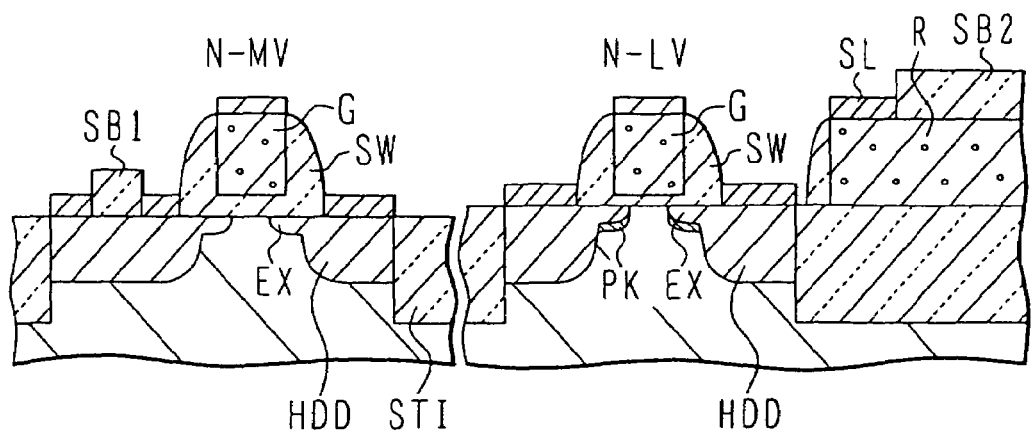
FIGS. 2A and 2B are a schematic cross sectional view showing the structure of a sample having a 2.5 V n-channel transistor, a 1.2 V n-channel transistor and a polysilicon resistor with a salicide block layer, illustrating the preliminary experiments made by the present inventors, and a graph showing a change in a threshold value relative to a gate length.

FIG. 2A is a schematic diagram showing the structure of a manufactured sample. STI was formed in a silicon substrate by HDP-CVD, and necessary wells were formed. Gate insulating films having different thicknesses were formed and a polysilicon layer was deposited covering the gate insulating films. The polysilicon layer was patterned to form gate electrodes G and a resistor R.

A 2.5 V operation voltage transistor N-MV has the gate electrode G made of n-type polysilicon and formed on the gate insulating film, and side wall spacers SW. Source/drain regions are constituted of extension regions EX having shallow junctions and high concentration regions HDD. A salicide block layer SB1 is partially formed on one of the source/drain regions.

A 1.2 V operation voltage transistor N-LV has a gate electrode G formed on the thin gate insulating film and made of the same polysilicon layer as that of the gate electrode of the 2.5 V transistor, side wall spacers SW, n-type extension regions EX having shallow junctions, p-type pocket regions PK formed around the extension regions, and high concentration regions HDD. Samples having different gate lengths were formed for both N-MV and N-LV.

A resistor R of p-type polysilicon is formed on the isolation region STI. A salicide block layer SB2 for preventing a silicidation reaction is formed on the resistor portion of the resistor R, the salicide block layer SB2 being made of the same insulating layer as that of the salicide block layer SB1. The salicide block layers were grown to a thickness of 50 nm by thermal CVD using TEOS as main source gas at a substrate temperature of 620° C. for about several tens minutes to one hundred minutes.

Cobalt silicide layers SL are formed on the silicon surfaces outside the salicide block layers SB1 and SB2 to form low resistance portions, through a primary reaction RTA at 540° C. for 30 seconds and a secondary reaction RTA at 840° C. for 30 seconds. Samples subjected to the salicidation process without forming the salicide block layer were also formed.

Figure 2B:
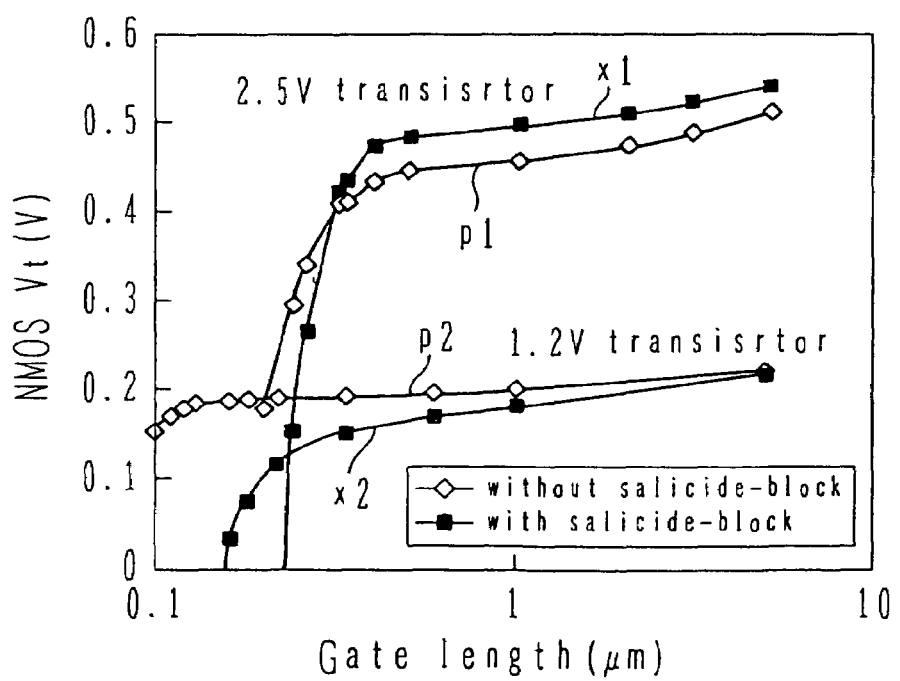

FIG. 2B is a graph showing a dependency of a threshold value Vt of the manufactured NMOS transistors upon a gate length. Curves p1 and p2 interconnecting measurement points indicated by white hollow symbols are for the samples without the salicide block layer. Curves x1 and x2 interconnecting measurement points indicated by black solid symbols are for the samples with the salicide block layers. 2.5 V transistors p1 and x1 have a small difference between the threshold value adjusting ion implantation conditions, and for the samples having the gate length of 1 μm or longer, a difference between plots is no a significant difference. However, with the salicide block layers, the threshold value lowered steeply at the gate length of 0.25 to 0.3 μm or shorter. However, a difference between threshold values is not so large.

The characteristics p2 of 1.2 V transistors without the salicide block layer was those predictable. The spots x2 of the samples with the salicide layers show that as the gate length becomes shorter, the threshold value lowers and the reduction factor of the threshold value becomes larger, also in the range of the gate length of 1 μm or longer, as compared to the sample p2. At the gate length of 0.2 μm or shorter, the samples do not have a transistor function.

Even at the gate length (0.35 to 1 μm) at which 2.5 V transistors without the pocket region have no threshold value reduction, 1.2 V transistors formed with the silicidated pocket regions show a threshold value reduction. Unpredictable defects appear due to formation of the salicide block layers.

IEEE TRANSACTIONS ON ELECTRON DEVICES, Vol. 49, No. 11, November 2002, pp. 2031 reports that P doped at a concentration of $7 \times 10^{20}$ cm$^{-3}$ shows abnormal diffusion.

The salicide block layer is formed by CVD at 620° C. for about several tens minutes to one hundred minutes. It can be considered that P diffuses abnormally due to the CVD heating process and the threshold value of a short channel transistor lowers. A CVD temperature for the salicide block layer was lowered from CVD at 600° C. using TEOS to plasma CVD at 400° C. A steep reduction in the threshold value was not observed.

In order to suppress P abnormal diffusion and prevent a threshold value variation, it is expected to be effective if diffusion is suppressed by setting a low temperature of heat treatment which requires some process time, after P doped high concentration source/drain regions are formed.

620° C. is higher than the temperature at which amorphous silicon crystallizes. It is considered that abnormal diffusion occurs at such a high temperature. Abnormal diffusion is expected to be avoided at a temperature of 500° C. or lower sufficiently lower than the crystallization temperature.

In the experiments by the present inventors, the secondary reaction of the salicidation process is performed by RTA at 840° C. However, the process time is as sufficiently short as 30 seconds and impurity diffusion is not large. Such a short time process is difficult in the case of insulating film growth CVD which requires about several tens to one hundred minutes considering the temperature stability of a wafer, film forming, gas exhaust and the like. RTA for impurity activation is performed at a higher temperature. However, its process time is as short as several seconds and impurity diffusion is not large. As described above, the most important factor is the temperature at which a salicide block layer is grown.

Such abnormal diffusion is very small if As is used as impurities, and definitely negligible if B is used as impurities, which were experimentally confirmed from the characteristics of transistors.

It has been found from the above-described experiment results that the unknown problem of low voltage SRAM defects can be solved by using phosphorus (P) as impurities in the source/drain regions of n-type MOS transistors even if miniaturization is achieved by large stress STI.

By using a salicide block layer, a resistor can be formed by minimizing an increase in the number of processes. It has also been found that the unknown problem of the steep increase in the short channel effects of NMOS transistors having a gate length of 0.2 μm, can be solved by suppressing P abnormal diffusion in the source/drain regions by forming the salicide block layer at a low temperature of 500° C. or lower.

Next, embodiments based upon such knowledge will be described.

Figure 3A:
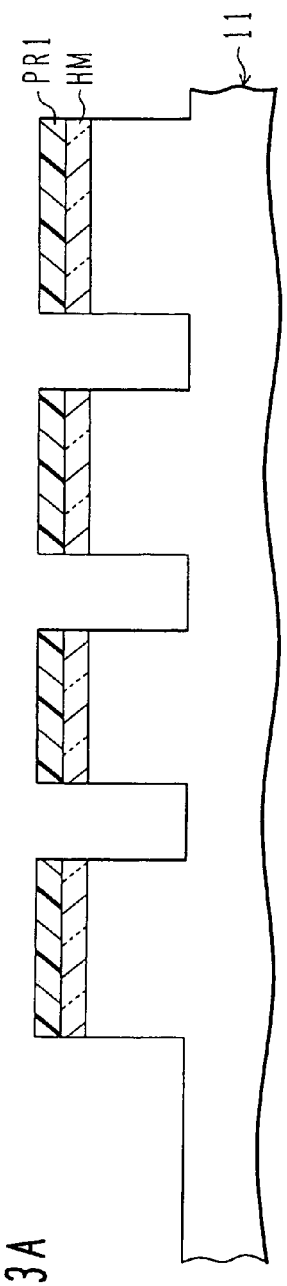

As shown in FIG. 3A, on the surface of a silicon substrate 11, a hard mask layer HM is deposited by CVD. For example, the hard mask layer is a lamination of an oxide film having a thickness of 15 nm and a nitride film having a thickness of 110 nm. On the surface of the hard mask HM, a photoresist mask PR1 defining an isolation trench is formed. By using the photoresist mask PR1 as a mask, the hard mask layer is etched and then the silicon substrate 11 is etched. The trench to be etched has, for example, a minimum width of 0.18 μm and a depth of 0.3 μm, and has a portion having an aspect ratio much larger than 1. The photoresist mask PR1 is thereafter removed.

Figure 3B:
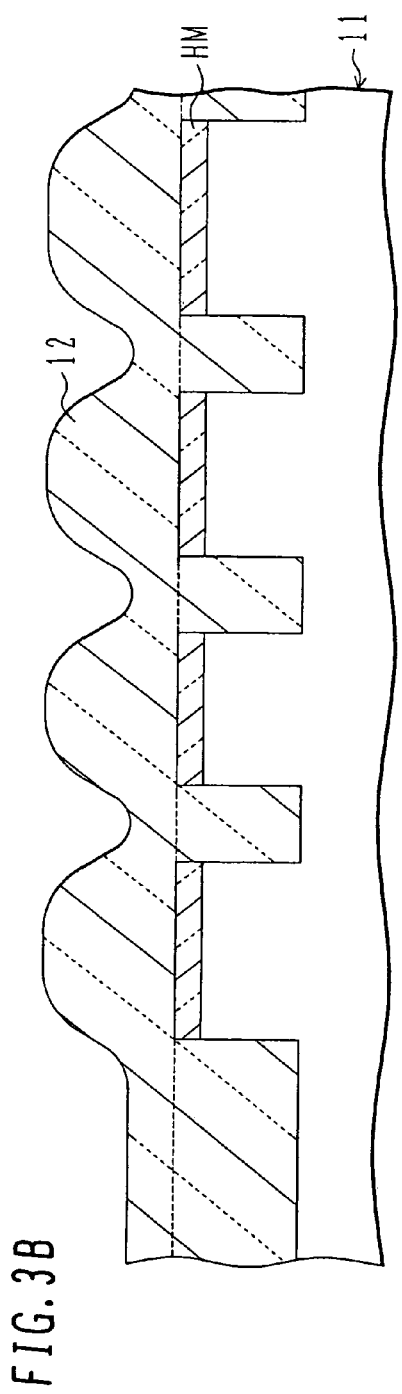

As shown in FIG. 3B, the surface of the trench is thermally oxidized, for example, at 1100° C. to form an oxide film having a thickness of 40 nm, and thereafter a silicon oxide film is deposited to a thickness of 550 nm (0.55 μm) by high density plasma (HDP) CVD using $He/SiH_4/O_2$. The silicon oxide film 12 buries the trench without any void. The silicon oxide film 12 above the hard mask HM is polished and removed by chemical mechanical polishing (CMP). The hard mask layer HM is thereafter removed.

Figure 3C:
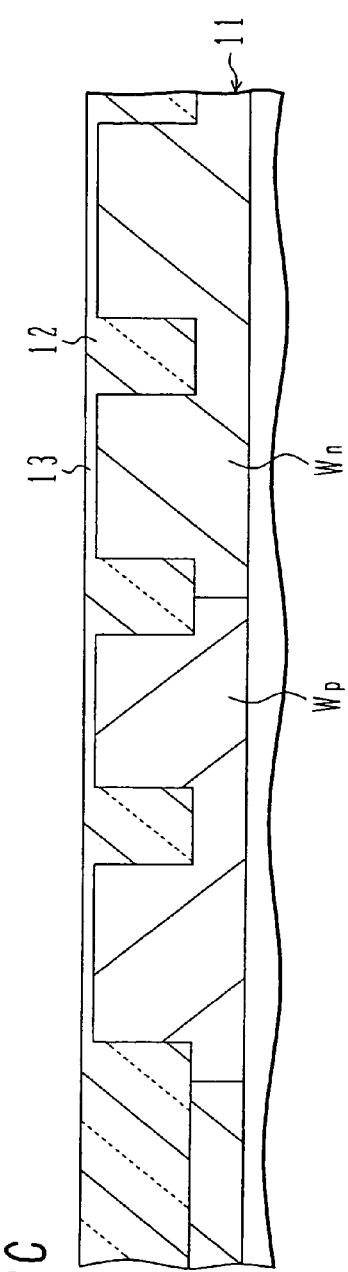

As shown in FIG. 3C, STI 12 buried with the silicon oxide film defines active regions. A through oxide film 13 is formed on the surfaces of the active regions, and ions are implanted by using a resist mask to form p-type wells Wp (n-channel regions) and n-type wells Wn (p-channel regions). The through oxide film 13 is thereafter removed, and a new gate oxide film is grown. If transistors operating at different voltages are to be formed, gate insulating films having different thicknesses corresponding to the operation voltages are formed.

In the following, description will be made by using a 1.2 V operation transistor as an example. High precision transistors for an input/output circuit and transistors with ESD protection resistors are also formed.

Figure 3D:
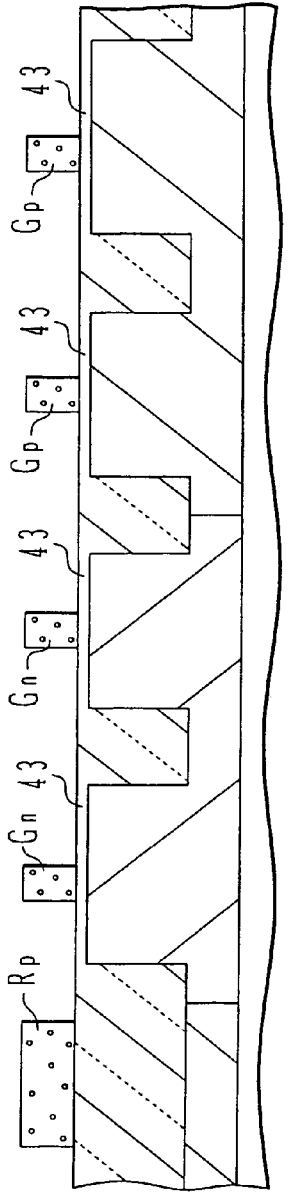

As shown in FIG. 3D, on the surface of each active region where a 1.2 V operation transistor is to be formed, a gate oxide film 43 having a thickness of 2.2 nm is formed by thermal oxidation, e.g., at 850° C. A non-doped polysilicon layer is deposited on the substrate surface to a thickness of about 180 nm by CVD and patterned by using a photoresist pattern. Gate electrodes Gn and Gp are therefore formed above the active regions, and a resistor Rp is formed on the isolation region STI.

Figure 3E:
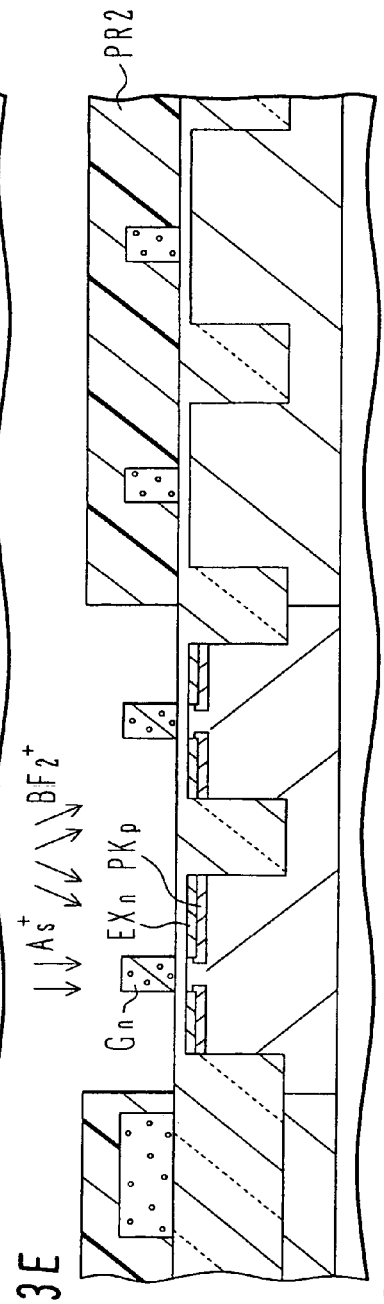

As shown in FIG. 3E, a photoresist mask PR2 is formed covering the p-channel regions and resistor, and $As^+$ ion implantation for extension regions and $BF_2^+$ oblique ion implantation for pocket regions are performed relative to the n-channel regions. Formed therefore are n-type extension regions EXn and p-type pocket regions PKp surrounding the extension regions. Even if As is used, since its dose is small, there is only a small possibility that transistors are made defective due to dislocation. The resist mask PR2 is thereafter removed.

Figure 3F:
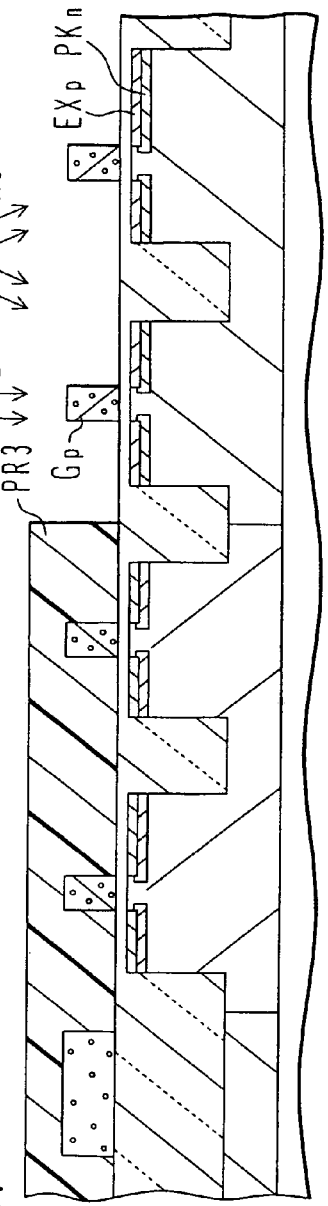

As shown in FIG. 3F, a photoresist mask PR3 is formed covering the n-channel regions and resistor, and $B^+$ ion implantation for extension regions and $As^+$ oblique ion implantation for pocket regions are performed relative to the p-channel regions. Formed therefore are p-type extension regions EXp and n-type pocket regions PKn surrounding the extension regions. The resist mask PR3 is thereafter removed.

Figure 3G:
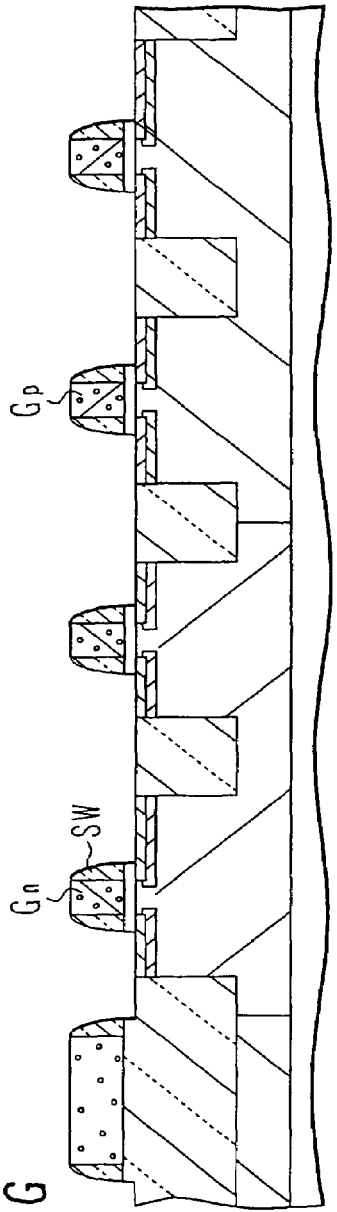

As shown in FIG. 3G, a silicon oxide film is deposited on the whole substrate surface to a thickness of 130 nm by low pressure TEOS-CVD at a substrate temperature of, e.g., 620° C., and anisotropically etched by reactive ion etching (RIE) to form side wall spacers SW on the side walls of the gate electrode and resistor.

Figure 3H:
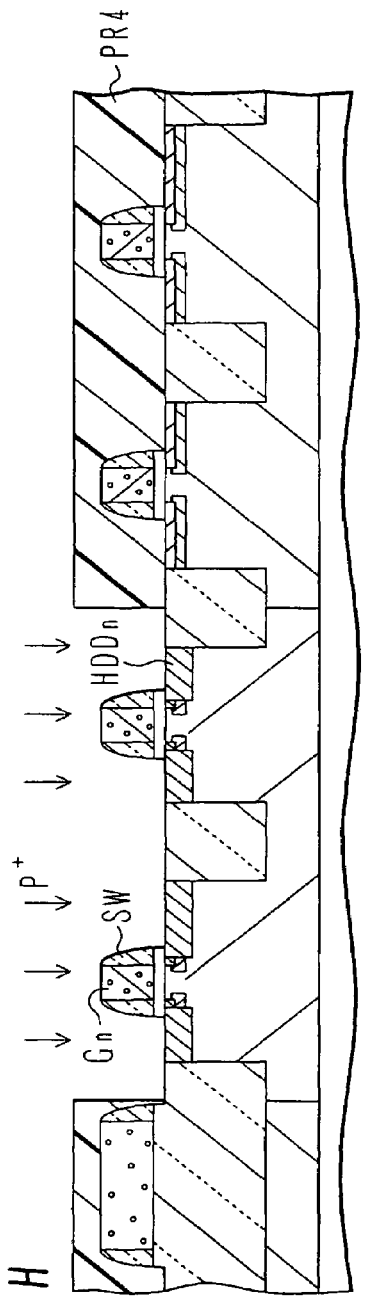

The substrate temperature of 620° C. in the oxide film deposition process will not cause abnormal diffusion because implanted impurities are As. Even P is used as the n-type impurities, abnormal diffusion will not occur because of a low concentration. The temperature of 620° C. can relatively reduce charge traps and the like and realize hot carrier resistance, and defective dielectric breakdown and the like will not occur. As shown in FIG. 3H, a photoresist mask PR4 is formed covering the resistor and p-channel regions, and $P^+$ ions are heavily implanted into the n-channel regions at an acceleration energy of 11 keV and a dose of $6.0 \times 10^{15}$ cm$^{-2}$. This ion implantation forms high concentration n-type source/drain regions HDDn outside the side wall spacers SW. Although the ion implantation is performed at the high concentration, since P is used, no problem occurs such as that a stress in STI increases and a number of silicon crystal defects are formed lowering a yield of SRAMs operating at a low voltage. The resist mask PR4 is thereafter removed.

Figure 3I:
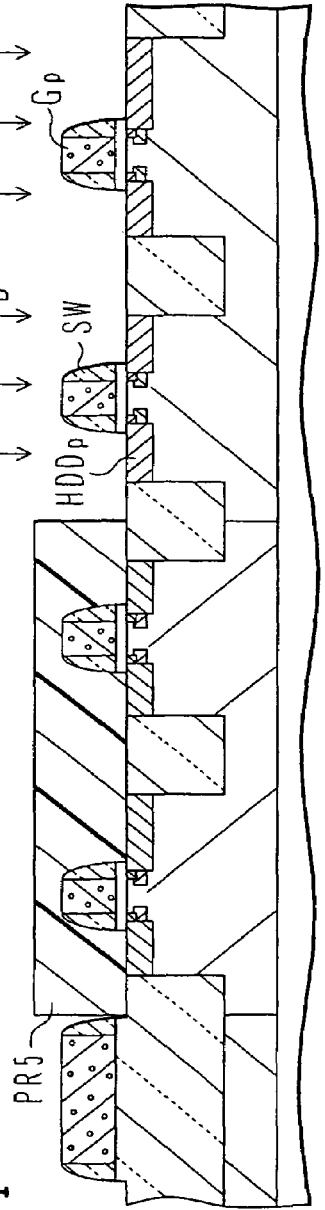

As shown in FIG. 3I, a photoresist mask PR5 is formed covering the n-channel regions, and $B^+$ ions are heavily implanted into the resistor Rp and p-channel regions at an acceleration energy of 5 keV and a dose of $4.0 \times 10^{15}$ cm$^{-2}$. In the p-channel regions, high concentration p-type source/drain regions HDDp are formed outside the side wall spacers SW.

In the resistor Rp, p-type impurities are implanted at a high concentration to form p-type polysilicon. The p-type polysilicon is the material suitable for a high precision resistor having a smallest temperature coefficient among silicon resistors.

The resist mask PR5 is thereafter removed. Rapid thermal annealing is performed at 1025° C. for 3 seconds in an $N_2$ atmosphere to activate implanted impurity ions.

As shown in FIG. 3J, a silicon oxide film is deposited on the whole substrate surface to a thickness of 50 nm by plasma CVD at a substrate temperature of 350° C. using TEOS as source gas. Since this CVD is performed at 350° C. sufficiently lower than 500° C., phosphorus (P) abnormal diffusion will not occur even if the high concentration phosphorus diffusion region exists. The silicon oxide film can be formed at the low temperature because it is sufficient if the silicon oxide film has the salicide block function and is not necessary to have the film dense conditions and the like.

A photoresist mask PR6 is formed which is used for forming salicide block layers on the deposited silicon oxide film, and anisotropical etching is performed to pattern the silicon oxide film. In the structure shown, a salicide block layer SB is formed on a central surface of the resistor Rp shown in the left end, and a salicide block layer SB is formed on one of the source/drain regions of the n-channel transistor at the left and on one of the source/drain regions of the p-channel transistor at the right.

As shown in FIG. 3K, for example, a Co film having a thickness of 8 nm is formed by sputtering, a primary silicidation reaction is performed by RTA at 540° C. for 30 seconds, and then the unreacted Co film is removed. Thereafter, a secondary silicidation reaction is performed by RTA at 840° C. for 30 seconds to form low resistance silicide layers SL. The surface of the polysilicon resistor Rp under the salicide block layer SB is not silicidated so that a high precision resistor having a desired resistance value can be formed. In the source/drain regions of the transistors, the regions under the salicide block layers SB constitute the ESD protection resistors integral with the source/drain regions.

Figure 3L:
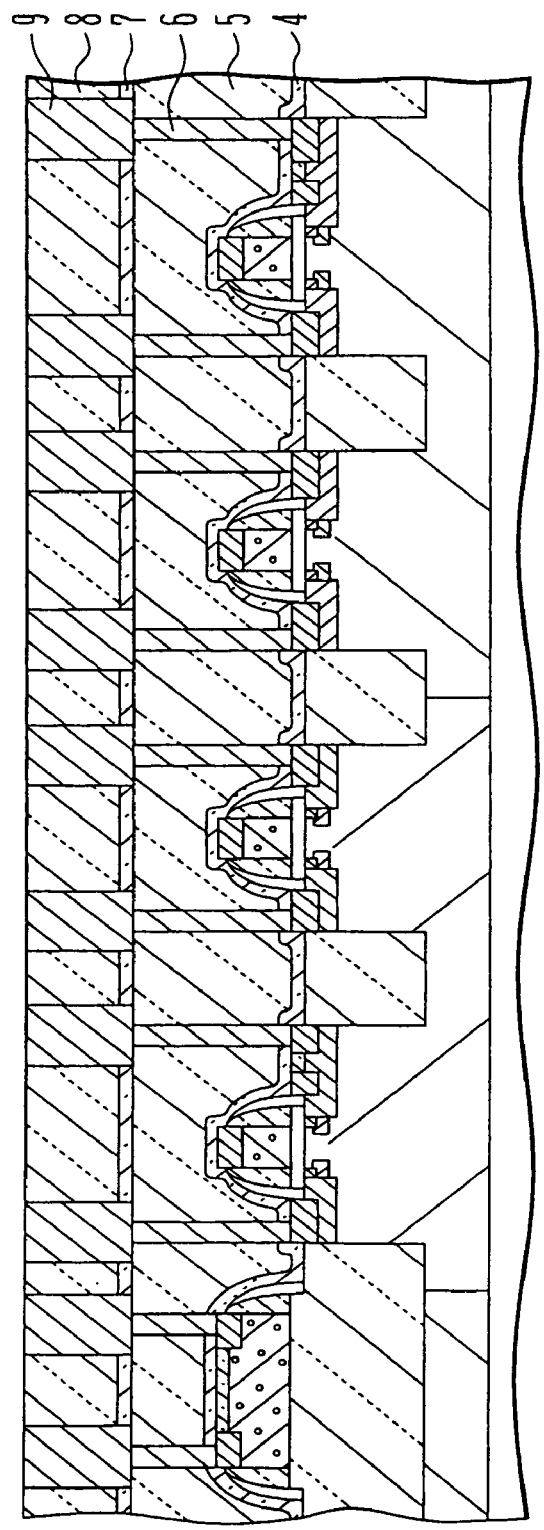

As shown in FIG. 3L, a silicon nitride film 4 is deposited on the substrate surface to a thickness of 50 nm by plasma CVD at a substrate temperature of 500° C. or lower, and a silicon oxide film 5 having a thickness of 900 nm is deposited on the silicon nitride film by HDP-CVD. After the surface is planarized by CMP, contact holes are opened. W is buried in the contact holes and its unnecessary portion is removed to form W plugs 6 in the contact holes.

A silicon nitride film 7 and a silicon oxide film 8 are deposited on the whole substrate surface, and Cu wirings 9 are formed by a damascene method. If necessary, other wiring layers are stacked to form a multilayer wiring structure.

According to the above-described embodiment, STI has a portion having an aspect ratio larger than 1 so that high density integration is possible. STI having a portion with an aspect ratio larger than 1 can be formed buried with the HDP silicon oxide film without any void.

Although STI made of the HDP silicon oxide film generates a strong stress, a number of defects to be caused by crystal defects can be prevented from being formed, by using phosphorus (P) for the high concentration source/drain regions.

The resistor can be formed by a minimum increase in the number of processes, by using the salicide block layers and sharing the common process for the impurity ion implantation for forming the polysilicon resistor and diffusion layer resistor and for the impurity ion implantation for forming the transistor source/drain regions. Since the process of depositing the salicide block layers is performed at a low temperature of 500° C. or lower, abnormal diffusion can be prevented even if the source/drain regions heavily doped with phosphorus exist, and the characteristics of a short channel n-type transistor can be maintained. A high precision analog resistor is formed by using p-type polysilicon. The ESD protection resistor can be formed simply by using the salicide block layer in the same active region as that of the transistor.

In the description of this embodiment, one kind of the n-channel transistor and p-channel transistor is shown. In an actual semiconductor device, there are strong needs for mounting a variety of devices such as a logical circuit operating at a low voltage, an SRAM circuit, an input/output circuit operating at a middle voltage and a nonvolatile flash memory. A control circuit for a flash memory uses 5 V for read, smaller than 10 V for write/erase. Both a low threshold value transistor operating at high speed and a high threshold value transistor having a small off leak current are required to be mounted in some cases.

In the following, description will be made on an embodiment forming a plurality kind of transistors. Although high precision resistors used in an analog/digital conversion circuit and ESD protection resistors are also formed, the resistor forming process is similar to that of the above-described embodiment and is omitted in the subsequent drawings.

Figure 4:
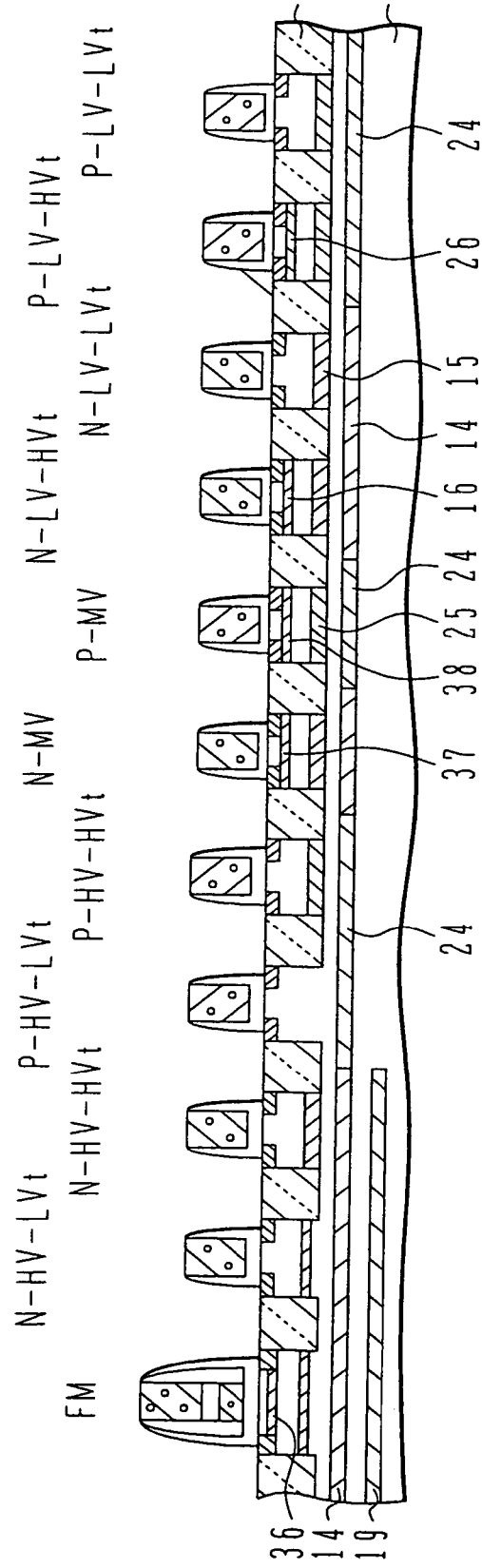
FIG. 4 is a cross sectional view showing the structure of a semiconductor device according to an embodiment of the present invention.

FIG. 4 shows eleven kinds of transistors integrated in a semiconductor device. A transistor FM represents a flash memory. A high voltage, low threshold value transistor N-HV-LVt represents an n-channel MOS transistor having a high breakdown voltage and a low threshold value. A high voltage, high threshold value transistor N-HV-HVt represents an n-channel MOS transistor having a high breakdown voltage and a high threshold value. A high voltage, low threshold value transistor P-HV-LVt represents a p-channel MOS transistor having a high breakdown voltage and a low threshold value. A high voltage, high threshold value transistor P-HV-HVt represents a p-channel MOS transistor having a high breakdown voltage and a high threshold value. The high voltage is, for example, 5 V.

A middle voltage transistor N-MV represents a transistor used in an input/output interface, e.g., a 2.5 V operation n-channel MOS transistor. A middle voltage transistor P-MV represents a transistor used in an input/output interface, e.g., a 2.5 V operation p-channel MOS transistor. The middle voltage is not limited to 2.5 V, but may be 3.3 V, 5 V, 1.8 V and 1.2 V. A high precision resistor is also formed in the input/output circuit.

A low voltage, high threshold value transistor N-LV-HVt represents an n-channel MOS transistor having a low breakdown voltage and a high threshold value. A low voltage, low threshold value transistor N-LV-LVt represents an n-channel MOS transistor having a low breakdown voltage and a low threshold value. A low voltage, high threshold value transistor P-LV-HVt represents a p-channel MOS transistor having a low breakdown voltage and a high threshold value. A low voltage, low threshold value transistor P-LV-LVt represents a p-channel MOS transistor having a low breakdown voltage and a low threshold value. The low voltage is, for example, 1.2 V.

An ESD protection resistor is connected, if necessary, to a transistor connected to a power supply voltage or to an input signal supply terminal. As described in the above embodiment, the ESD protection resistor can be formed integrally with a transistor by not forming a partial silicide layer in the source/drain regions.

The n-channel high voltage transistor and flash memory are formed in a p-type well 14 in an n-type well 19. The n-channel MOS transistor is formed in the p-type well 14, and the p-channel MOS transistor is formed in an n-type well 24. Channel stop regions 15 and 25 are formed in the transistors other than the p-channel MOS transistor P-HV-LVt having a high breakdown voltage and a low threshold value.

Threshold value adjustment ion implantation regions 16 and 26 are formed in the low voltage, high threshold value transistors N-LV-HVt and P-LV-HVt, respectively. Threshold value adjustment ion implantation regions 37 and 38 are formed in the middle voltage transistors N-MV and P-MV, respectively. A threshold value adjustment ion implantation region 36 is formed in the flash memory FM. The threshold value of each transistor is adjusted by corporation of the threshold value adjustment ion implantation region and channel stop region.

In the following, description will be made on the manufacture processes for manufacturing the semiconductor device shown in FIG. 4.

Figure 5A:
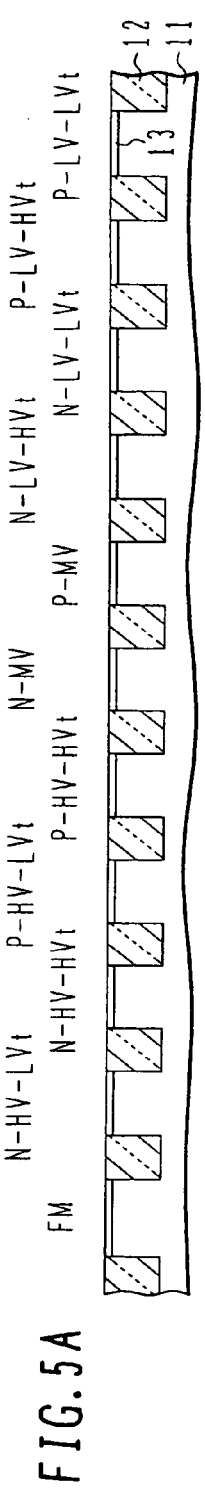
FIGS. 5A to 5Z are cross sectional views illustrating main processes of a manufacture method for the semiconductor device shown in FIG. 4.

As shown in FIG. 5A, an isolation trench is formed in a semiconductor substrate 11, having a portion with an aspect ratio of 1 or higher. The isolation trench is buried with a high density plasma (HDP) silicon oxide film, and CMP is performed to form a shallow trench isolation (STI) 12. Next, the silicon substrate surface is thermally oxidized to form a silicon oxide film 13 having a thickness of, e.g., 10 nm.

Figure 5B:
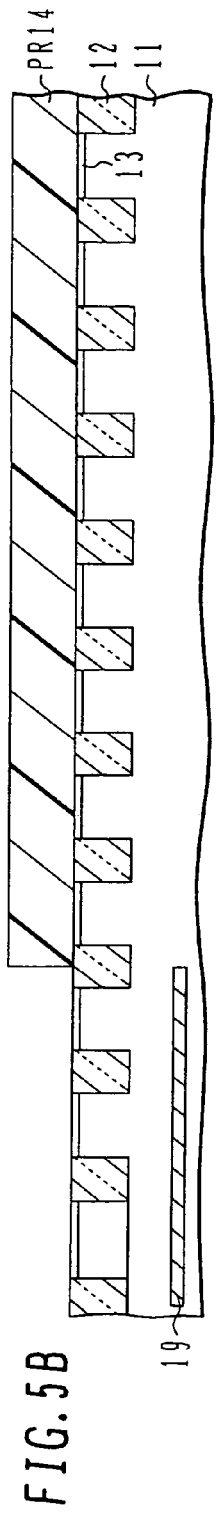

As shown in FIG. 5B, a photoresist mask PR14 is formed exposing the flash memory cell FM and high voltage n-channel MOS transistor N-HV regions, and P$^+$ ions for forming the n-type well 19 are implanted at an acceleration energy of 2 MeV and a dose of $2 \times 10^{13}$ cm$^{-2}$. The resist mask PR14 is thereafter removed.

Figure 5C:
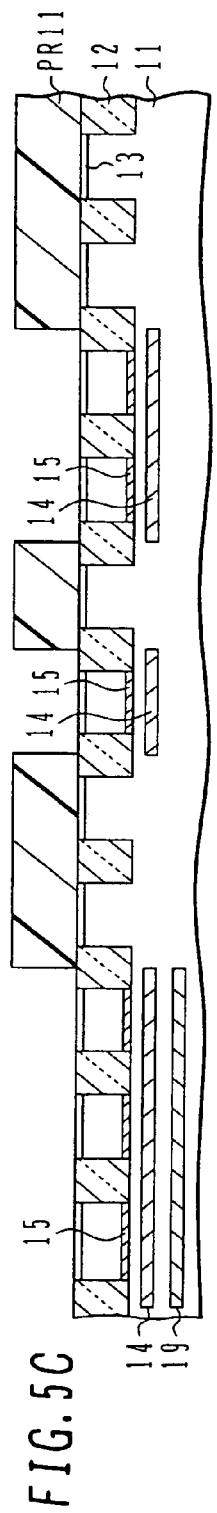

As shown in FIG. 5C, a photoresist mask PR11 is formed having openings exposing the flash memory cell FM and n-channel MOS transistor regions, B$^+$ ions for forming the p-type well 14 are implanted at an acceleration energy of 400 keV and a dose of $1.5 \times 10^{13}$ cm$^{-2}$, and B$^+$ ions for forming the channel stop region 15 are implanted at an acceleration energy of 100 keV and a dose of $2 \times 10^{12}$ cm$^{-2}$. The resist mask PR11 is thereafter removed. In this manner, the p-type well 14 and channel stop region 15 are formed.

Figure 5D:
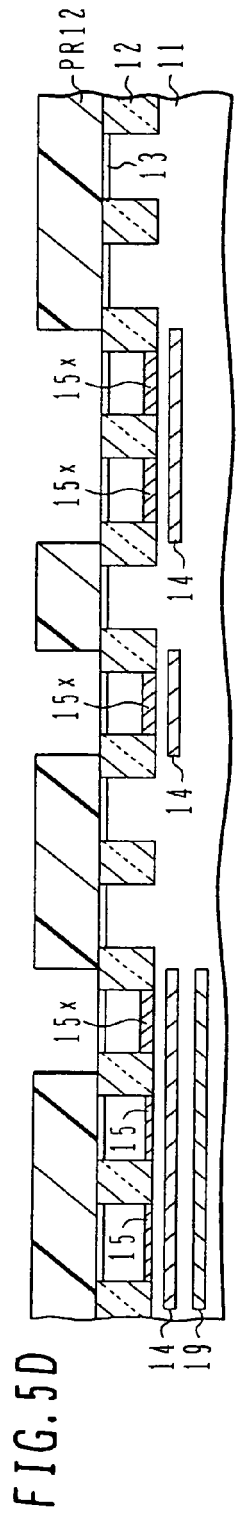

As shown in FIG. 5D, a photoresist mask PR12 is formed exposing the n-channel MOS transistor regions excepting the flash memory FM region and high voltage, low threshold value n-channel MOS transistor N-HV-LVt, and B$^+$ ions for forming the channel stop region are additionally implanted at an acceleration energy of 100 keV and a dose of $6 \times 10^{12}$ cm$^{-2}$. A channel stop region 15x additionally implanted with ions is therefore formed. The resist mask PR12 is thereafter removed.

Figure 5E:
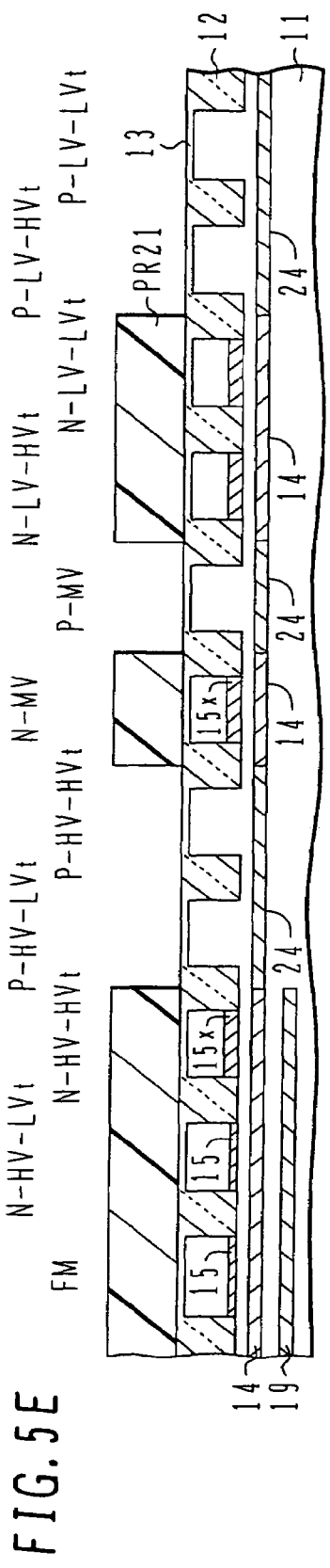

As shown in FIG. 5E, a photoresist mask PR21 is formed exposing the p-channel MOS transistor regions, and P$^+$ ions for forming the n-type well 24 are implanted at an acceleration energy of 600 keV and a dose of $1.5 \times 10^{13}$ cm$^{-2}$. The resist mask PR21 is thereafter removed.

Figure 5F:
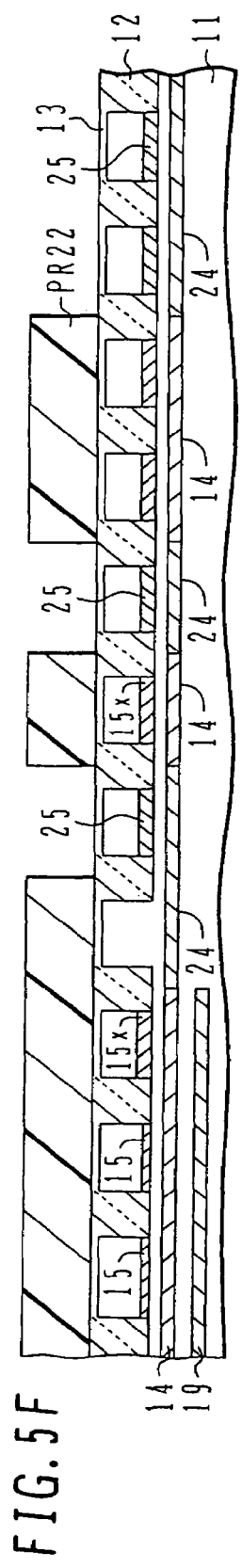

As shown in FIG. 5F, a photoresist mask PR22 is formed exposing the p-channel MOS transistor regions excepting the high voltage, low threshold value transistor regions, and P$^+$ ions for forming the channel stop region 25 are implanted at an acceleration energy of 240 keV and a dose of $4.5 \times 10^{12}$ cm$^{-2}$. The resist mask PR22 is thereafter removed.

Figure 5G:
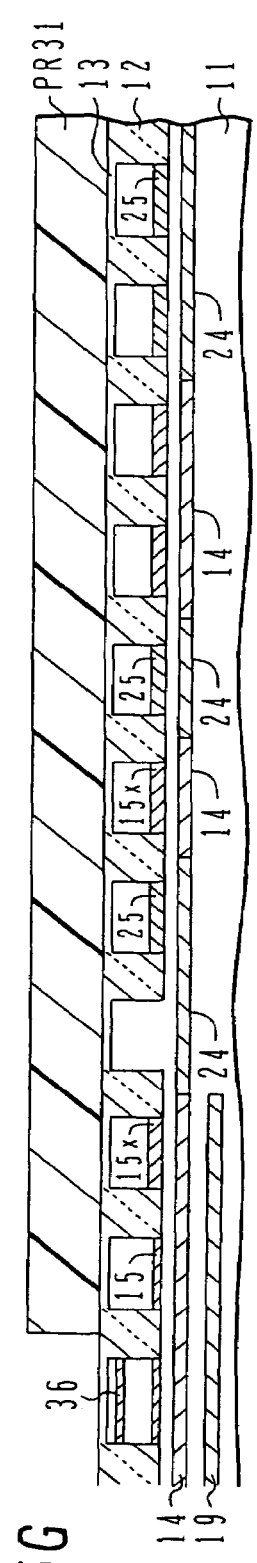

As shown in FIG. 5G, a photoresist mask PR31 is formed exposing the flash memory FM region, and B$^+$ ions for forming the threshold value adjustment region 36 are implanted at an acceleration energy of 40 keV and a dose of $6 \times 10^{13}$ cm$^{-2}$. The resist mask PR31 is thereafter removed. The silicon oxide film 13 on the surface of the semiconductor substrate is removed by HF solution to expose silicon surfaces of the active regions.

Figure 5H:
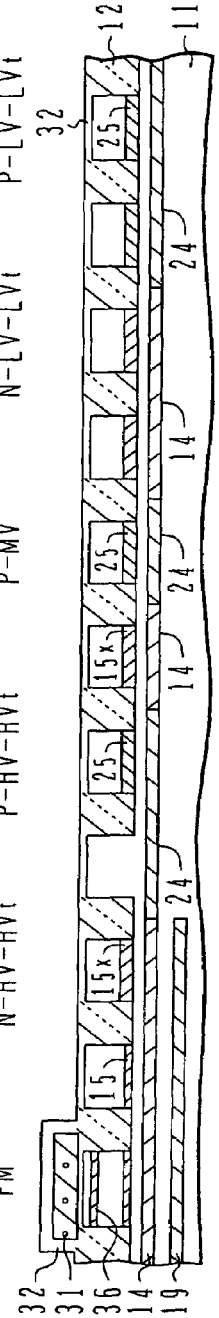

As shown in FIG. 5H, the semiconductor substrate surface is thermally oxidized to grow a tunneling oxide film having a thickness of about 10 nm. On the tunneling oxide film, an amorphous silicon film doped with phosphorus (P) and having a thickness of about 90 nm is deposited and patterned in the shape of a floating gate 31. The amorphous silicon film is transformed into a polysilicon film by a later heat treatment.

Figure 5I:
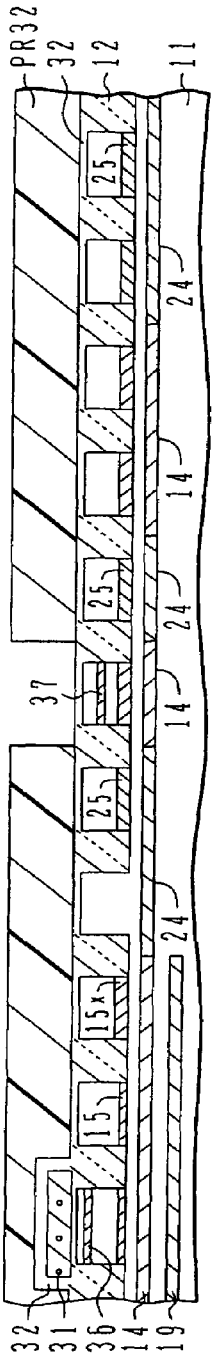

A silicon oxide film and a silicon nitride film are deposited to thicknesses of 5 nm and 10 nm respectively, covering the floating gate 31. The surface of the silicon nitride film is thermally oxidized by about 5 nm in thickness to form a silicon oxide film having a thickness of about 10 nm. An ONO film 32 is therefore formed having a total thickness of less than 20 nm, because part of SiN is consumed As shown in FIG. 5I, a photoresist mask PR32 is formed exposing the middle voltage n-channel MOS transistor N-MV region, and B$^+$ ions for forming the threshold value adjustment region 37 are implanted at an acceleration energy of 30 keV and a dose of $5 \times 10^{12}$ cm$^{-2}$. The resist mask PR32 is thereafter removed.

Figure 5J:
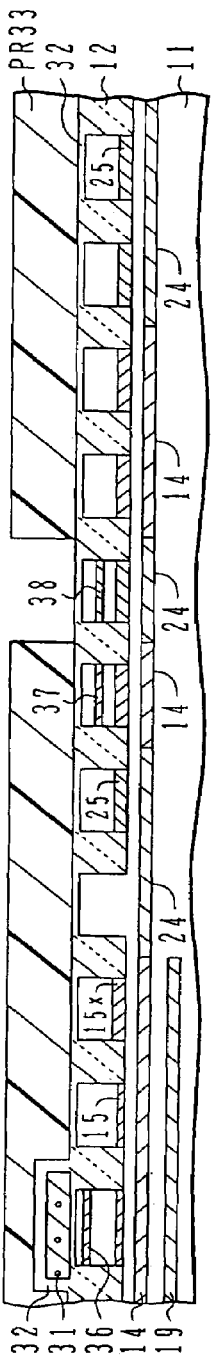

As shown in FIG. 5J, a photoresist mask PR33 is formed exposing the middle voltage p-channel MOS transistor P-MV region, and As$^+$ ions for forming the threshold value adjustment region 38 are implanted at an acceleration energy of 150 keV and a dose of $3 \times 10^{12}$ cm$^{-2}$. The resist mask PR33 is thereafter removed.

Figure 5K:
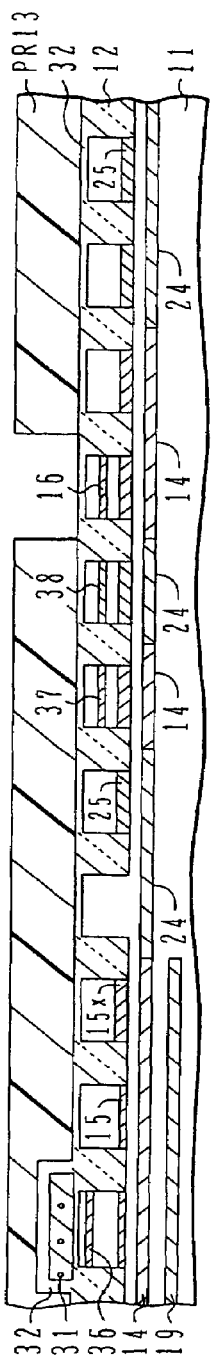

As shown in FIG. 5K, a photoresist mask PR13 is formed exposing the low voltage, high threshold value n-channel transistor N-LV-HVt region, and B$^+$ ions for forming the threshold value adjustment region 16 are implanted at an acceleration energy of 10 keV and a dose of $5 \times 10^{12}$ cm$^{-2}$. The resist mask PR13 is thereafter removed.

Figure 5L:
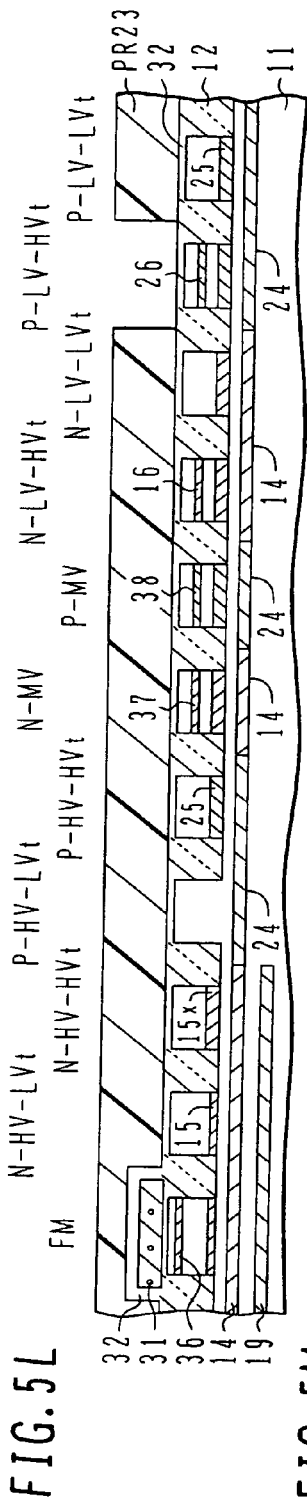

As shown in FIG. 5L, a photoresist mask PR23 is formed exposing the low voltage, high threshold value p-channel transistor P-LV-HVt region, and As$^+$ ions for forming the threshold value adjustment region 26 are implanted at an acceleration energy of 100 keV and a dose of $5 \times 10^{12}$ cm$^{-2}$. The resist mask PR23 is thereafter removed.

Ion implantation for forming the pocket regions is performed by using an extension region forming mask, relative to the low voltage transistor regions, as will be described in the following. The conditions of this ion implantation also controls the threshold value. Although the threshold value control ion implantation is not performed for the low voltage, low threshold value transistor regions, their threshold values are about 0.1 V due to the pocket region forming ion implantation. Similarly, the threshold values of the low voltage, high threshold value transistors are about 0.2 V.

Figure 5M:
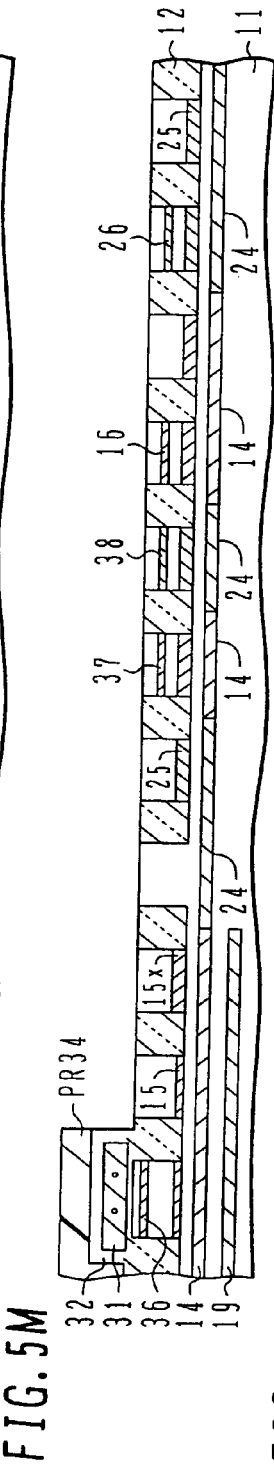

As shown in FIG. 5M, a photoresist mask PR34 is formed exposing the flash memory FM region, and the ONO film 32 other than in the FM region is removed. The resist mask PR34 is thereafter removed.

Figure 5N:
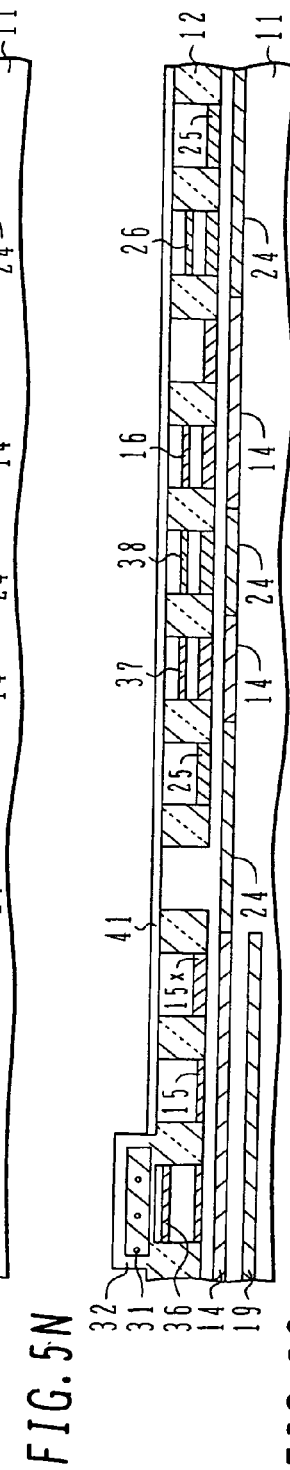

As shown in FIG. 5N, the substrate surface is thermally oxidized to form a silicon oxide film 41 having a thickness of 13 nm.

Figure 5O:
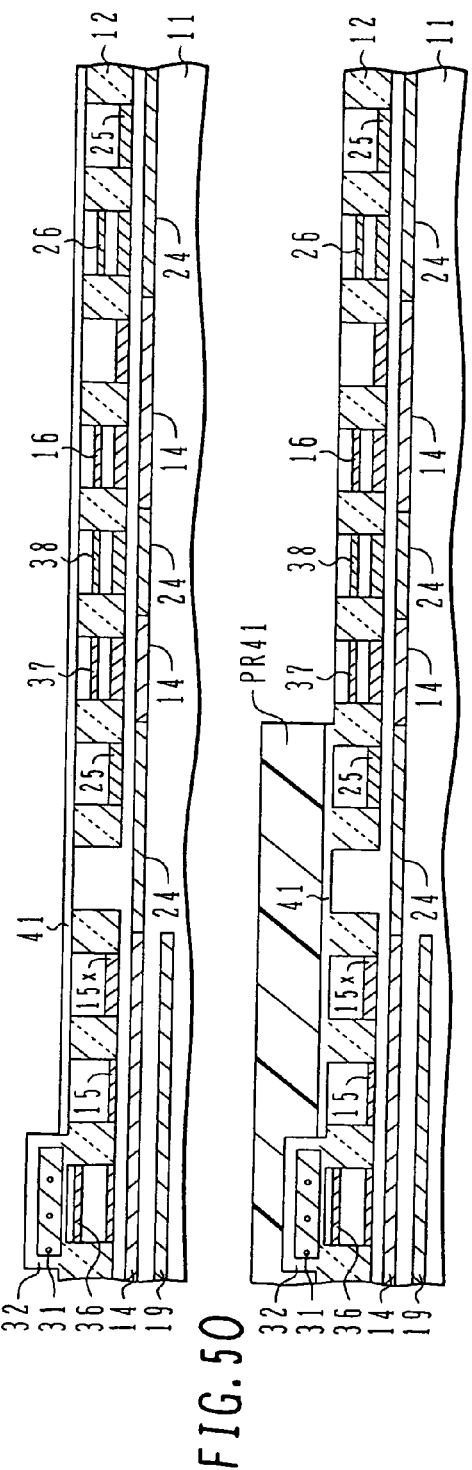

As shown in FIG. 5O, a resist mask PR41 is formed covering the flash memory cell region and high voltage transistor regions, and the silicon oxide film 41 in the exposed region is removed. The resist mask is then removed. On the exposed substrate surface, a silicon oxide film 42 having a thickness of 4 nm is formed by thermal oxidation for 2.5 V operation transistors. For 3.3 V operation transistors, a thickness of the silicon oxide film 42 is set to 6 nm.

Figure 5P:
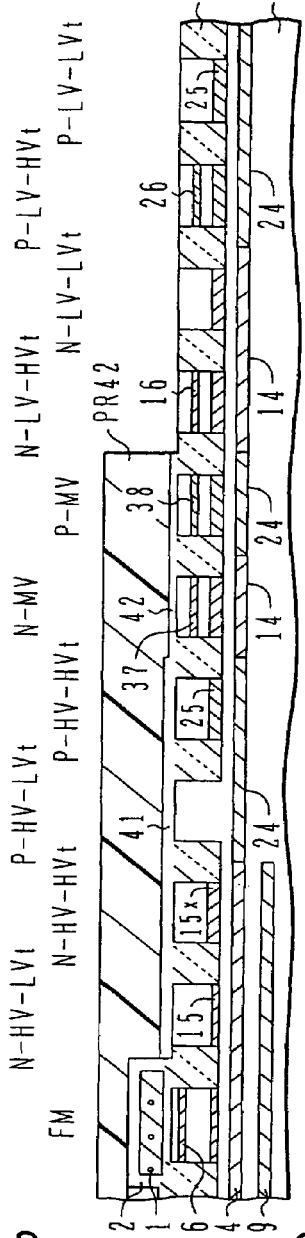

As shown in FIG. 5P, by using a resist mask PR42, the thermal oxidation film 42 in the low voltage transistor regions is removed. The resist mask PR42 is thereafter removed.

Figure 5Q:
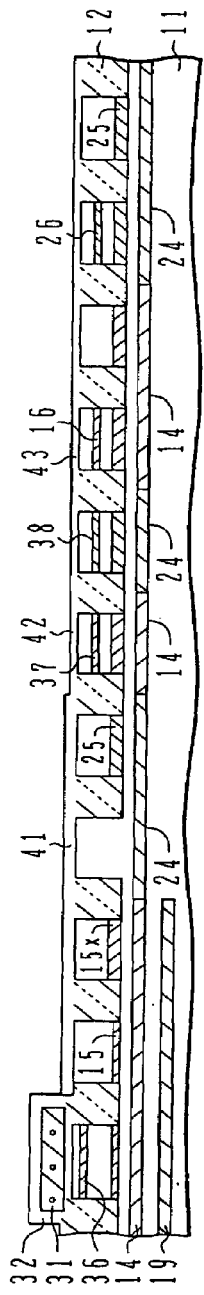

As shown in FIG. 5Q, on the exposed substrate surface, a silicon oxide film 43 having a thickness of 2.2 nm for the 1.2 V operation transistors is formed by thermal oxidation. With this thermal oxidation, the silicon oxide film 42 in the 2.5 V regions grows to a thickness of 5 nm, and the silicon oxide film 42 in the 3.3 V regions having a thickness of 6 nm grows to a thickness of 7 nm. The silicon oxide film 41 in the 5 V regions grows ultimately to a thickness of 16 nm.

Figure 5R:
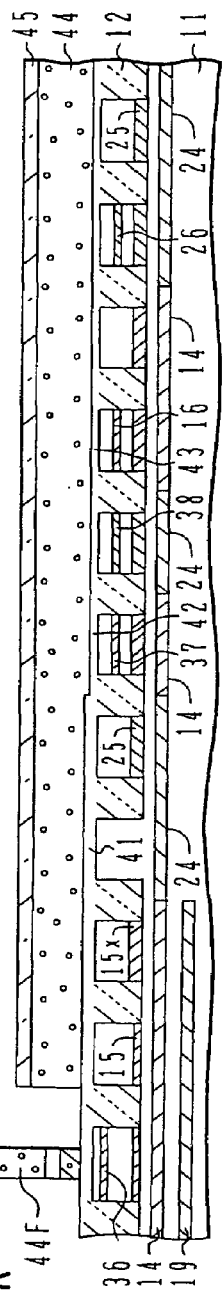

As shown in FIG. 5R, on the surface of the substrate having the gate insulating films of three different thicknesses, a polysilicon film 44 having a thickness of 180 nm is formed by CVD, and a silicon nitride film 45 having a thickness of 30 nm is deposited on the polysilicon film by plasma CVD. The silicon nitride film functions as an antireflection film and can also be used as an etching mask. A gate electrode 44F of the flash memory is patterned by photolithography and etching.

Figure 5S:
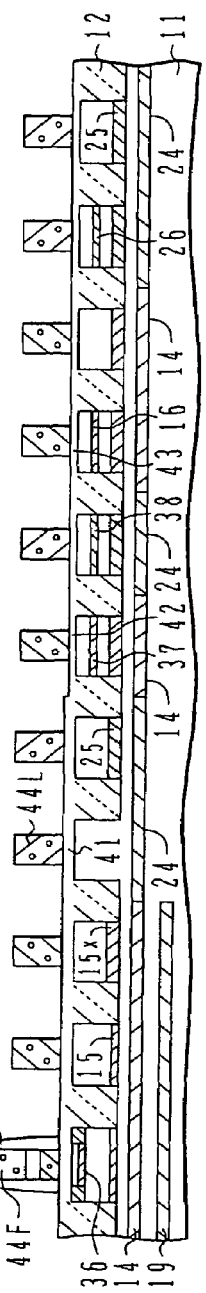

As shown in FIG. 5S, the side walls of the gate electrode of the flash memory are thermally oxidized, and ion implantation is performed to form source/drain regions. After source/drain implantation, the side walls of the gate electrode of the flash memory are thermally oxidized again. The silicon nitride film on the polysilicon film protects polysilicon film from the oxidation. An insulating film such as a silicon nitride film is formed by thermal CVD, covering the gate electrode of the flash memory, and side wall spacers 46 of silicon nitride are formed on the side walls of the flash memory by reactive ion etching (RIE). The silicon nitride film on the polysilicon film deposited after polysilicon deposition by plasma CVD is also removed during RIE. Thereafter, in the logical circuit area, the polysilicon film is selectively etched leaving the gate insulating films, to pattern gate electrodes 44L of the transistors of the logical circuit, by photolithography and etching.

At the same time, the polysilicon resistors on the STI region are patterned. In the following processes, the polysilicon resistor is covered with a photoresist mask for unnecessary ion implantation processes, and it is exposed for the high concentration p-type source/drain region forming ion implantation, to obtain a desired resistivity.

Figure 5T:
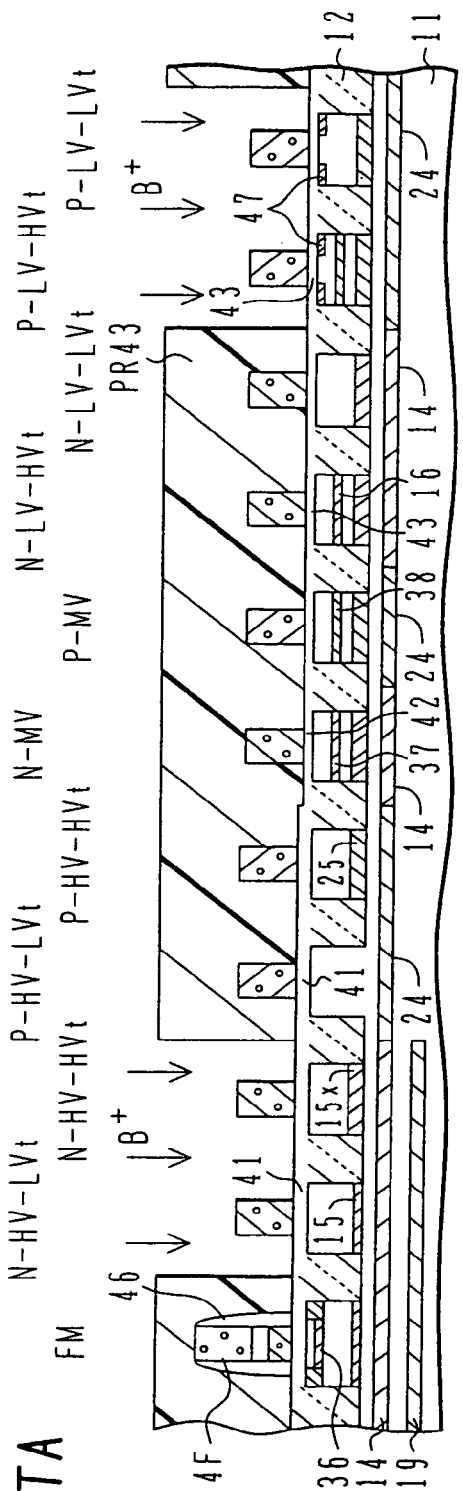
Figure 5T:
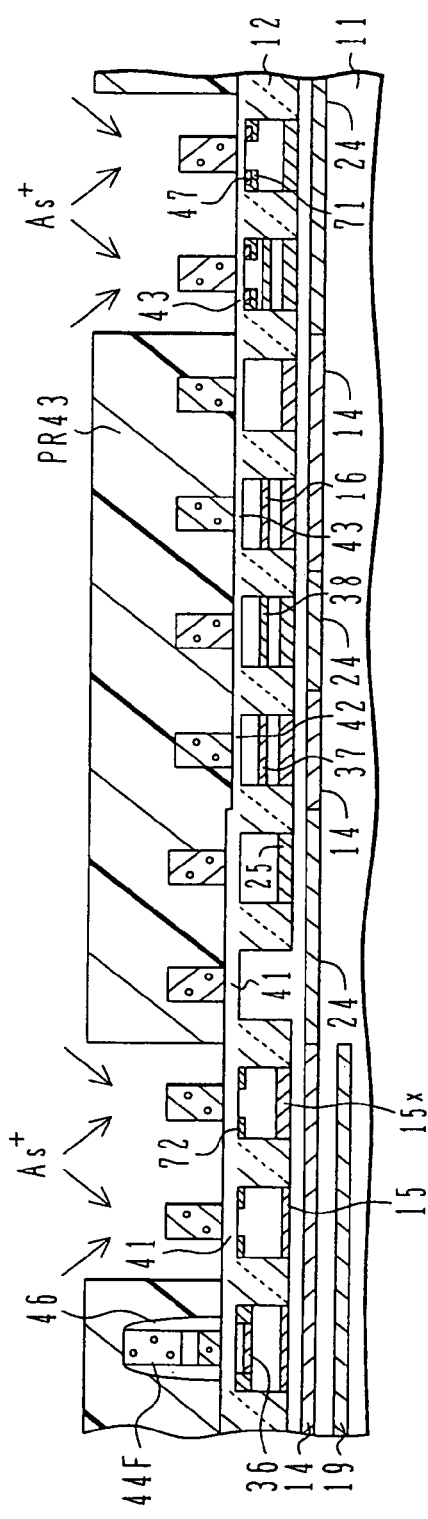

As shown in FIG. 5TA, a resist mask PR43 is formed having openings in the 1.2 V operation PMOS regions and 5 V operation NMOS regions, and $B^+$ ions are implanted along a vertical direction at an acceleration energy of 0.5 keV and a dose of $3.6 \times 10^{12}$ cm$^{-2}$.

Since the gate oxide film 43 in the 1.2 V operation PMOS regions is as thin as about 1.5 nm to 2.2 nm, the implanted $B^+$ ions penetrate through the gate insulating film 43 and form p-type extension regions 47. Since the gate oxide film 41 in the 5 V operation NMOS regions is as considerably thick as 15 nm to 16 nm and the acceleration energy of $B^+$ ions is very low at 0.5 keV, the implanted $B^+$ ions remain in the gate oxide film 41 and rarely reach the silicon substrate.

As shown in FIG. 5TB, by using the same resist mask PR43, As$^+$ ions are implanted along four directions tilted by 28 degrees from the substrate normal at an acceleration energy of 120 keV and a dose of $5.5 \times 10^{12}$ cm$^{-2} \times 4$. The four directions are symmetrical in the substrate in-plane and are spaced by an interval of 90 degrees: typically right and left two directions as viewed in FIG. 5TB and two directions perpendicular to the drawing sheet. Since the acceleration energy is as high as 120 keV, the As$^+$ ions penetrate through the thick gate oxide film 41.

In the 1.2 V operation PMOS regions, n-type pocket regions 71 are formed surrounding the previously formed extension regions 47. In the 5 V operation NMOS regions, As$^+$ ions penetrate through the gate oxide film 41 and reach the silicon substrate to form n-type LDD regions 72. With the oblique ion implantation along a plurality of directions, unpredicted effects to be described later can be obtained.

Figure 6A:
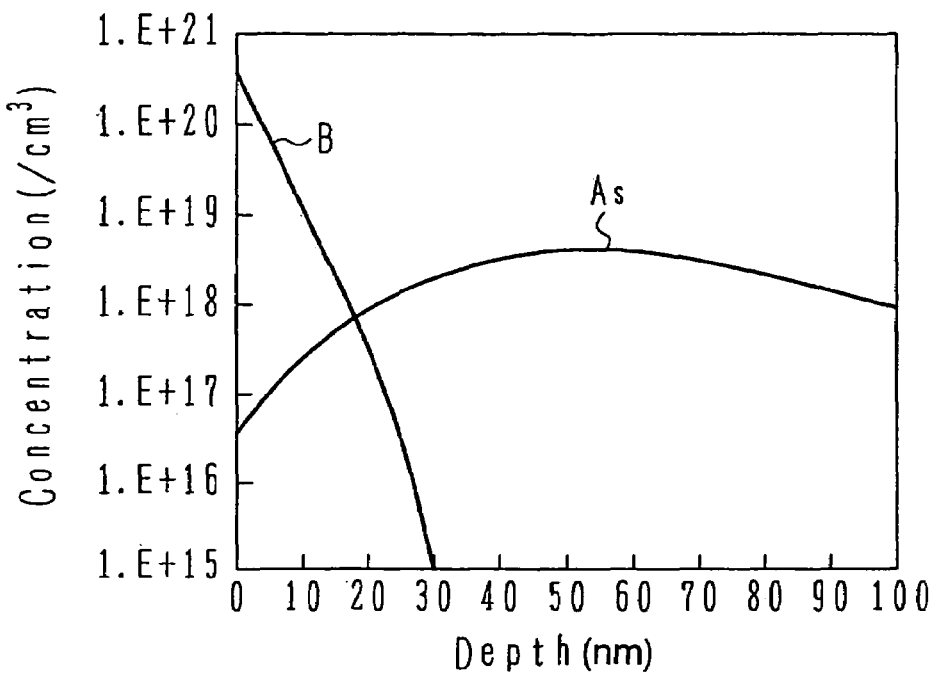
FIGS. 6A and 6B are graphs showing impurity concentration distributions after the processes shown in FIGS. 5TB and 5UB.

FIG. 6A is a graph showing distributions of B and As in a depth direction doped by the ion implantation processes shown in FIGS. 5TA and 5TB. The impurity concentration distributions immediately after ion implantation were obtained through simulation. These distributions are immediately after the ion implantation and the diffusion is changed by subsequent heat treatment. As shown, a B concentration distribution lowers abruptly as the depth from the surface (depth=0) increases. In contrast, the As concentration distribution increases its concentration gradually as the depth from the depth of 0 increases, and forms a broad peak near at the depth of 50 nm.

In the 1.2 V regions, the high concentration p-type extension regions are formed shallowly near the surface, and the bottoms of the extension regions are surrounded by the n-type pocket regions.

In the 5 V regions, the region from the surface to a depth of 15 nm to 16 nm corresponds to the thick gate oxide film, and the deeper region corresponds to the silicon substrate. Therefore, the B concentration is already low in the silicon substrate, and As compensates for B to form the n-type regions. The distribution of As is broad and lightly doped drain (LDD) regions are formed.

The order of the p-type impurity ion vertical implantation along the vertical direction and the n-type impurity ion oblique implantation may be reversed. After both the ion implantation processes are completed, the resist mask PR43 is removed.

Figure 5U:
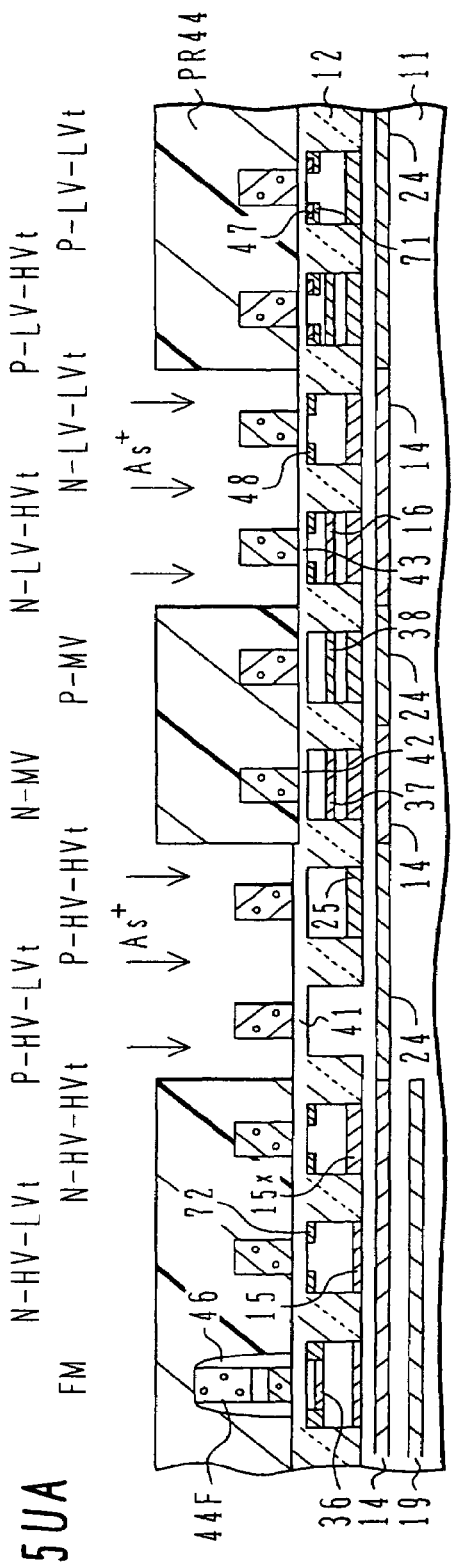
Figure 5U:
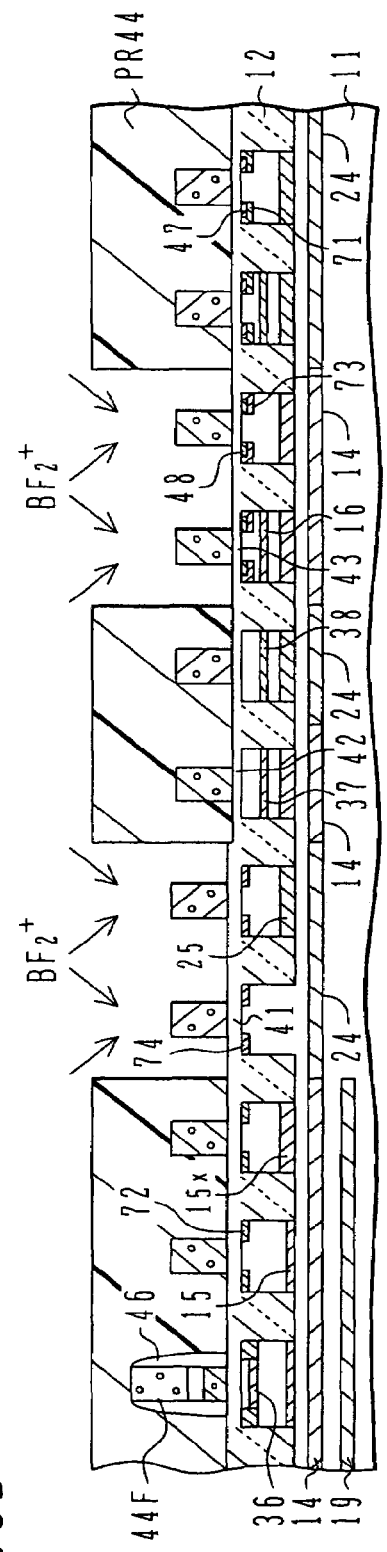

As shown in FIG. 5UA, a resist mask PR44 is formed having openings in the 1.2 V operation NMOS regions and 5 V operation PMOS regions, and As$^+$ ions are implanted along a vertical direction at an acceleration energy of 3 keV and a dose of $1.1 \times 10^{15}$ cm$^{-2}$.

In the 1.2 V operation NMOS regions, As$^+$ ions are implanted into the silicon substrate via the very thin gate oxide film 43 to form n-type extension regions 48. In the 5 V operation PMOS regions having the gate insulating oxide film 41 as considerably thick as 15 nm to 16 nm, As$^+$ ions implanted at the very low acceleration energy at 3 keV remain in the gate oxide film 41 and rarely reach the silicon substrate.

As shown in FIG. 5UB, BF$_2^+$ ions are implanted along four directions tilted by 28 degrees from the substrate normal at an acceleration energy of 80 keV and a dose of $8 \times 10^{12}$ cm$^{-2} \times 4$. Since the acceleration energy is high, the BF$_2^+$ ions penetrate even through the thick gate oxide film 41 to form p-type LDD regions 74 in the 5 V operation PMOS regions. In the 1.2 V operation NMOS regions, p-type pocket regions 73 are formed surrounding the n-type extension regions 48.

Figure 6B:
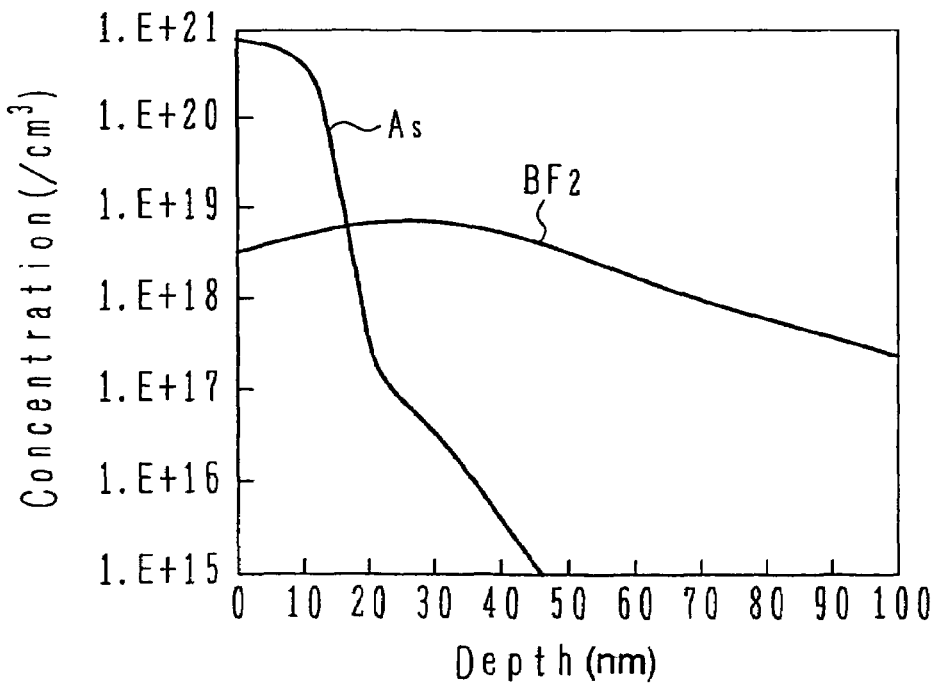

FIG. 6B is a graph showing distributions of As and BF$_2$ in a depth direction doped by the ion implantation processes shown in FIGS. 5UA and 5UB. The As distribution maintains a high impurity concentration down to the depth shallower than 10 nm from the surface, greatly lowers its concentration as the depth becomes deeper, and has a skirt from about a depth of 20 nm. The BF$_2$ distribution gradually increases the impurity concentration down to the depth of about 30 nm from the surface, and gradually reduces the impurity concentration as the depth becomes deeper. In the regions where the gate oxide film having the thickness of 15 to 16 nm, the As concentration in the silicon substrate is already greatly reduced so that BF$_2$ forms the p-type regions. The BF$_2$ distribution is broad so that lightly doped drain (LDD) regions are formed.

A flash memory control circuit and a logical circuit are often integrated together. A difference between operation voltages makes the film thickness ratio between gate insulating films very large. For the regions of the gate oxide films having a large thickness ratio of 2.2:15 to 16, ion implantation having a limited penetration depth and ion implantation penetrating the gate oxide film are performed. It is therefore possible to form the extension regions and pocket regions in the low voltage operation transistor regions and to form only the LDD regions in the transistor regions having the thick gate oxide film. It is desired that the thickness ratio between gate oxide films is a fivefold or more.

Figure 5V:
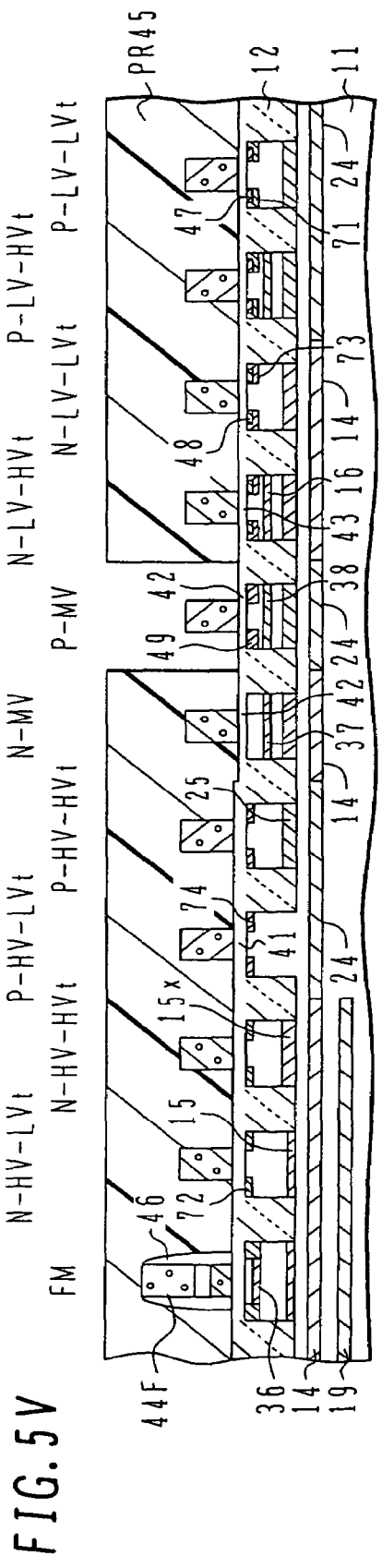

As shown in FIG. 5V, a resist mask PR45 is formed exposing the 2.5 V operation PMOS regions, and $BF_2^+$ ions are implanted at an acceleration energy of 10 keV and a dose of $7.0\times10^{13}$ cm$^{-2}$ to form p-type extension regions 49. The resist mask PR45 is thereafter removed.

Figure 5W:
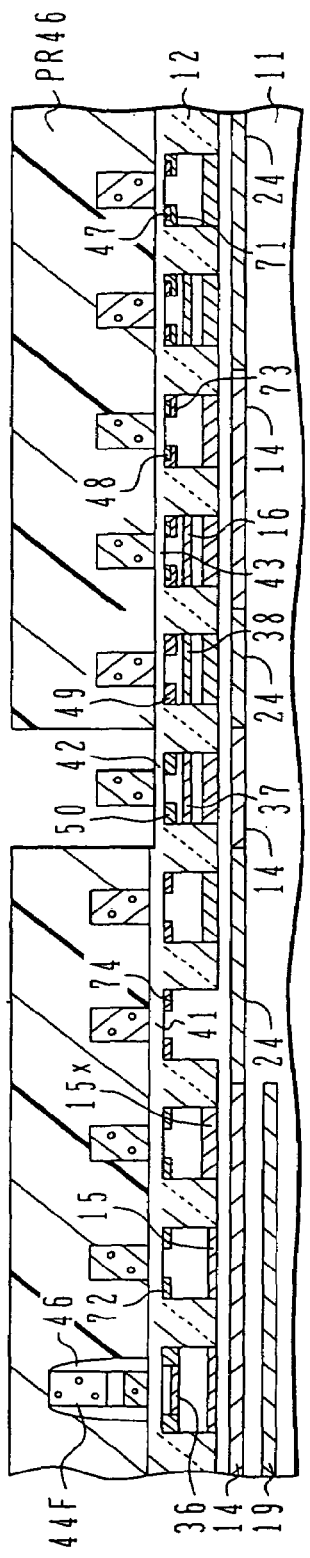

As shown in FIG. 5W, a resist mask PR46 is formed exposing the 2.5 V operation NMOS regions. As$^+$ ions are implanted at an acceleration energy of 10 keV and a dose of $2.0\times10^{13}$ cm$^{-2}$ and P$^+$ ions are implanted at an acceleration energy of 10 keV and a dose of $3.0\times10^{13}$ cm$^{-2}$ to form n-type extension regions 50. The resist mask PR46 is thereafter removed.

The specifications of I/O transistors are often changed in accordance with the customer needs. Even if the design of I/O transistors is changed, in order not to change the design of other transistors, independent processes are used for the I/O transistors.

As shown in FIG. 5X, a silicon oxide film having a thickness of about 100 nm is deposited on the whole substrate surface and anisotropically etched. With this etching, the unnecessary gate oxide film portions are also etched and removed, and thus all silicon surface of LV, MV and HV transistors are exposed. In the flash memory FM region, side wall spacers 64 of silicon oxide are formed on the side wall spacers 46 of silicon nitride. In each transistor region and polycrystalline resistor regions, side wall spacers 54 of silicon oxide are formed on the side walls of gate electrodes and polycrystalline resistor patterns.

A resist mask PR49 is formed exposing the flash memory FM and NMOS regions. P$^+$ ions are implanted into the silicon substrate exposed outside the side wall spacers, at an acceleration energy of 10 keV and a dose of $6.0\times10^{15}$ cm$^{-2}$ to form high concentration source/drain regions 55. P$^+$ ions are also implanted heavily into the gate electrodes of the NMOS transistors to form n-type gate electrodes. The resist mask PR49 is thereafter removed. Since the high concentration source/drain regions of NMOS transistors are formed in the high concentration phosphorus (P) doped regions, malfunction during a low voltage operation can be suppressed.

As shown in FIG. 5Y, a resist mask PR50 is formed exposing the PMOS regions and polycrystalline resistor regions. B$^+$ ions are implanted at an acceleration energy of 5 keV and a dose of $4.0\times10^{15}$ cm$^{-2}$ to form high concentration p-type source/drain regions 56. The gate electrodes are also doped into the p-type. The polycrystalline resistor is changed to a p-type polycrystalline resistor. The resist mask PR50 is thereafter removed.

Since high concentration ion implantation is performed in the state that the surfaces of the source/drain regions of all transistors are exposed, independently from the operation voltages and gate insulating films, high concentration source/drain regions can be formed efficiently for all transistors, especially the implantation energy can be reduced to minimize the short channel effect of LV transistors.

As in the previously-described embodiment, as shown in FIGS. 3J and 3K, a salicide block layer is disposed on the region where the resistor is formed, and a salicidation process is performed. A silicide layer SL is therefore formed on the high concentration source/drain regions of each transistor, on the gate electrodes and on the connection portions of each resistor.

As shown in FIG. 5Z, an interlayer insulating film 60 of silicon oxide or the like is deposited covering the flash memory, transistors and resistors. Contact holes are formed through the interlayer insulating film 60 at desired positions, and conductive plugs 61 are buried in the contact holes. Wirings 62 connected to the conductive plugs 61 are formed on the surface of the interlayer insulating film 60. These processes can be performed by well-known methods. It is preferable to form the interlayer insulating film at a temperature of 500° C. or lower.

If the STI isolation trench does not have a portion with an aspect ratio of 1 or higher, the isolation trench may be buried with tetraetoxysilane (TEOS) having a low stress, by CVD. In this case, high concentration As ions or high concentration As and P ions may be implanted to form high concentration n-type source/drain regions. Depending upon designs, the silicide block layer and silicidation process may be omitted.

Figure 7:
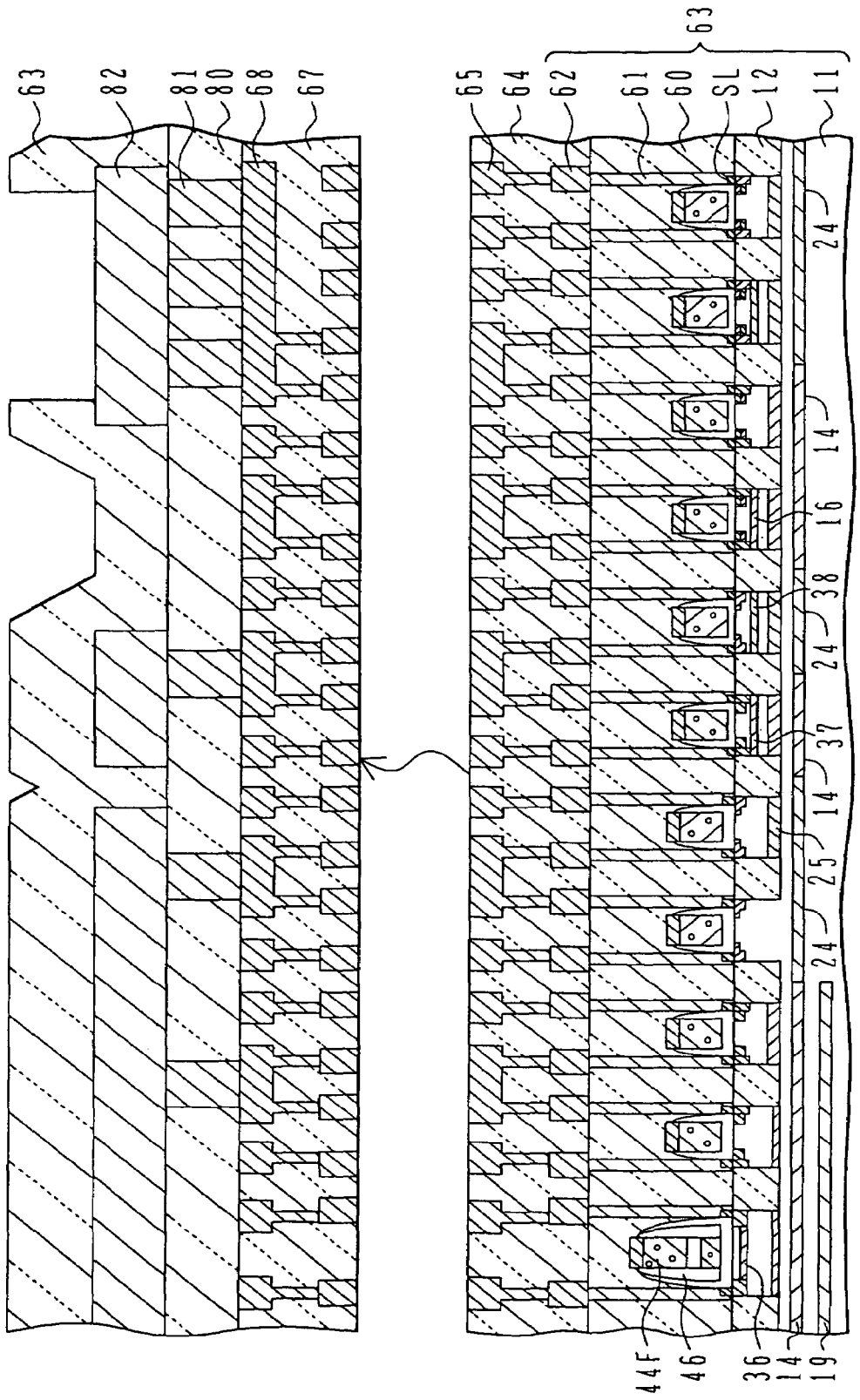
FIG. 7 is a cross sectional view showing an example of the structure of a semiconductor device with multilayer wirings.

FIG. 7 is a schematic diagram showing the structure of a semiconductor device having multilayer wirings disposed on the fundamental structure formed by the processes shown in FIGS. 5A to 5Z. A structure 63 corresponds to the structure shown in FIG. 5Z. On this structure, an interlayer insulating film 64 is formed and damascene wirings 65 are buried in this interlayer insulating film.

Similar processes are repeated to form the necessary number of wiring layers. On the interlayer insulating film 67, an uppermost damascene wirings 68 are formed. An interlayer insulating film 80 is formed on the uppermost damascene wirings 68, and lead conductive plugs 81 are buried in the interlayer insulating film. Pads and an uppermost wiring layer 82 connected to the conductive plugs 81 are formed. A protective layer 63 is formed and openings exposing the pads are formed. In this manner, a semiconductor integrated circuit device having multilayer wirings can be formed.

In the above-described embodiment, the LDD regions in the 5 V operation transistor regions are formed by oblique ion implantation. A junction breakdown voltage of a 5 V operation transistor was 11 V or higher. In the following, description will be made on why such a high breakdown voltage can be obtained.

Figure 8A:
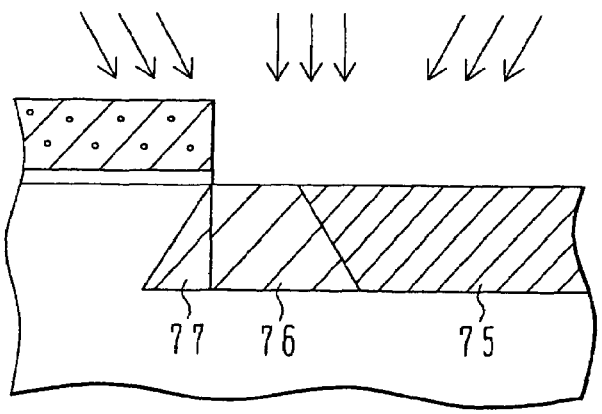
FIGS. 8A and 8B are a schematic cross sectional view showing an impurity concentration distribution in an LDD region formed by oblique ion implantation, and a graph showing a performance comparison between an LDD region formed by vertical ion implantation and an LDD region formed by oblique ion implantation.

FIG. 8A is a schematic cross sectional view showing impurity doped regions formed by oblique ion implantation along a plurality of directions. It is assumed that a gate electrode G extends along a direction perpendicular to the drawing sheet and ions are implanted along four directions tilted by left and right, and front and back by 28 degrees from the substrate normal direction. A region 75 undergoes oblique ion implantation along all of the four directions and is doped at a highest impurity concentration. A region 76 is masked with oblique ion implantation along one direction from upper left, undergoes oblique ion implantation along the remaining three directions, and is doped at a middle impurity concentration. A region 77 is shaded with the gate electrode, undergoes oblique ion implantation only along one direction, and is doped at a low impurity concentration.

The regions 75, 76 and 77 are studied in total. A sloped impurity concentration region is formed in which an impurity concentration gradually increases from the region under the gate electrode to the outward region and monotonously increases even in the region outside the gate electrode. The impurity concentration takes a constant value only at a position away from the gate electrode. By considering subsequent heat treatment and the like, it is expected that the stepwise impurity concentration distribution of a finished transistor changes to a distribution having a smooth gradient.

In the state that the side wall spacers and high concentration source/drain regions are formed, the LDD regions having a gradually decreasing impurity concentration are formed continuously with the high concentration source/drain regions. This may be ascribed to the improvements on the breakdown voltage of the source/drain regions.

Figure 8B:
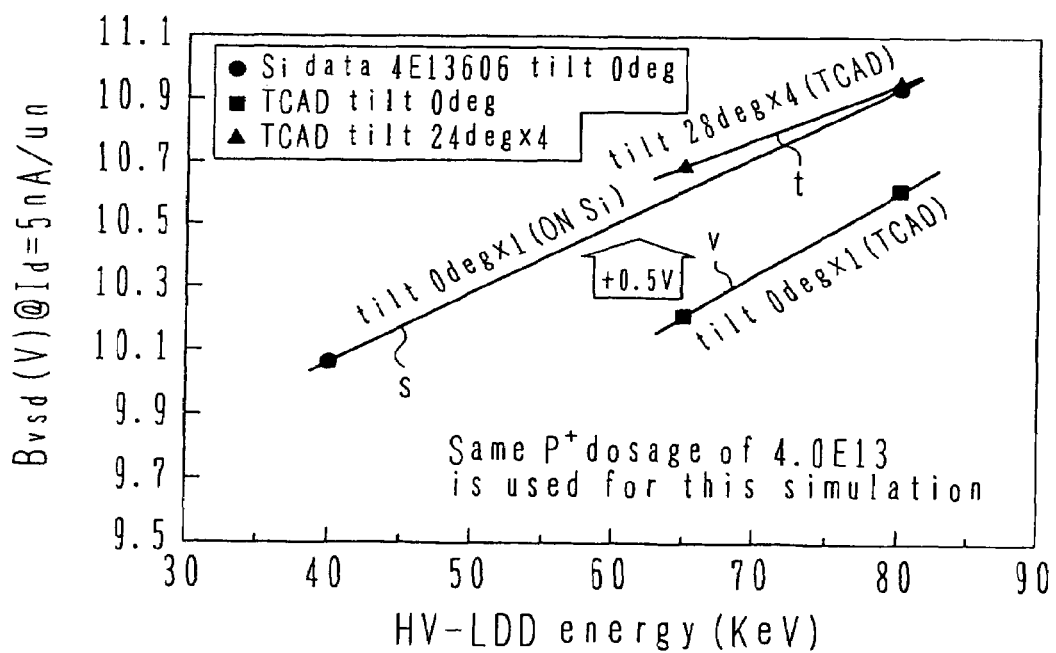

FIG. 8B is a graph showing a comparison of breakdown voltages between the case that the LDD regions are formed by ion implantation only along the vertical direction and the case that the LDD regions are formed by ion implantation along four directions tilted by 28 degrees from the substrate normal.

A curve v indicates a simulated breakdown voltage in the case that the LDD regions are formed by ion implantation only along the vertical direction. A curve t indicates a simulated breakdown voltage in the case that the LDD regions are formed by ion implantation along four directions tilted by 28 degrees from the substrate normal and the total dose is set to the same as that of the curve v. Similar results were obtained also from experiments.

As apparent from the graph, by adopting the oblique ion implantation, the breakdown voltage is improved by about 0.5 V. A curve s indicates a breakdown voltage measured from a sample subjected to vertical implantation of $P^+$ ions at the same dose. It has also been found that the breakdown voltage is improved by increasing an acceleration energy of oblique ion implantation.

A high breakdown voltage of the LDD regions formed by oblique ion implantation is not limited to the above-described structure. Description will be made on an embodiment extracting only the processes necessary for forming a single transistor, from the above-described embodiments.

Figure 9A:
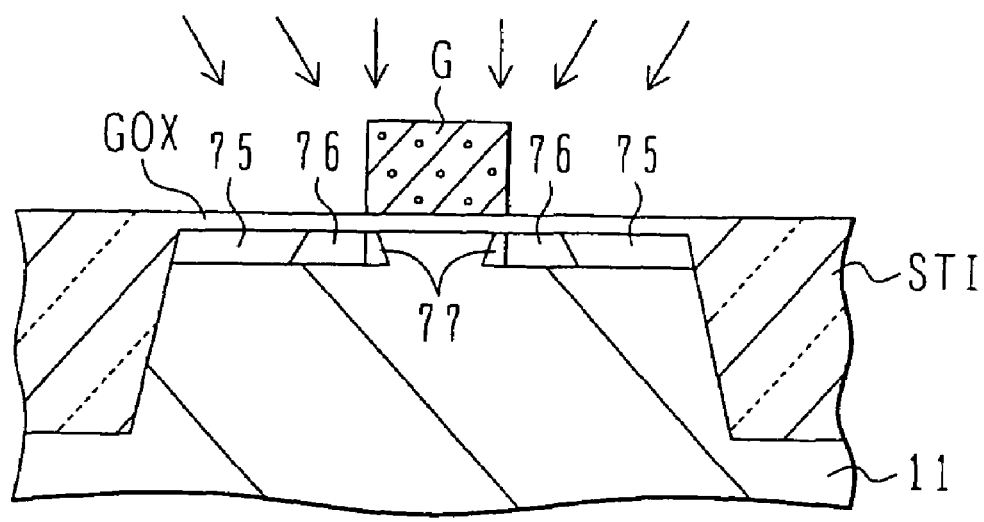
FIGS. 9A and 9B are cross sectional views illustrating main processes of a semiconductor manufacture method according to another embodiment of the present invention.

As shown in FIG. 9A, a shallow trench isolation STI is formed in a silicon substrate 11, and necessary ion implantation is performed to form a p-type active region. A gate oxide film Gox is formed on the active region, and a polysilicon layer is formed on the gate oxide film. The polysilicon layer is patterned to form a gate electrode G by photolithography and etching.

By using the gate electrode as a mask, n-type impurity ions are obliquely implanted along four directions tilted by about 28 degrees from the substrate normal or along a number of directions. The highest concentration region 75 is formed in a region remotest from the gate electrode. A middle concentration region 76 is formed between the end of the gate electrode and the region 75, and the lowest concentration region 77 is formed under the gate electrode end portion. The LDD regions having a concentration gradient along the horizontal direction can be formed by oblique ion implantation.

Figure 9B:
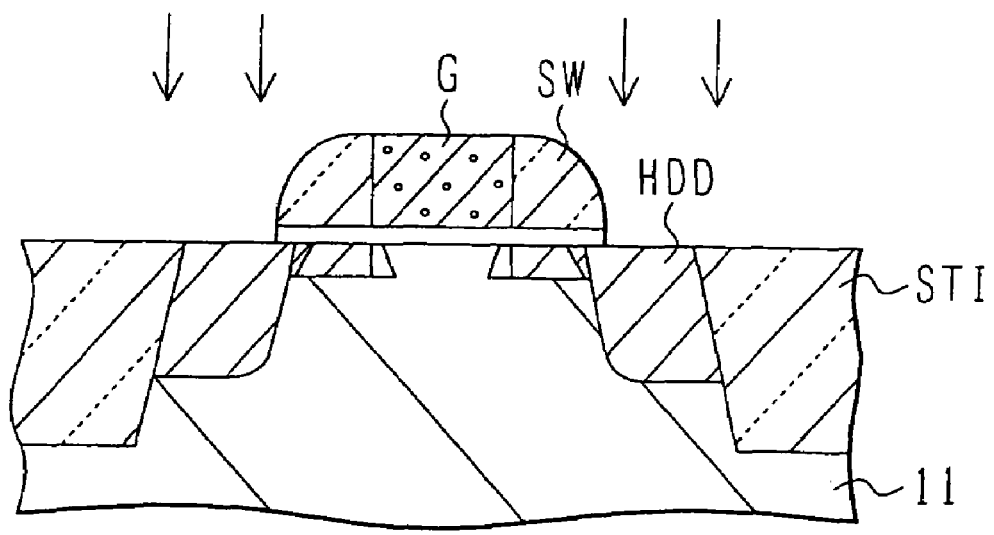
Figure 10A:
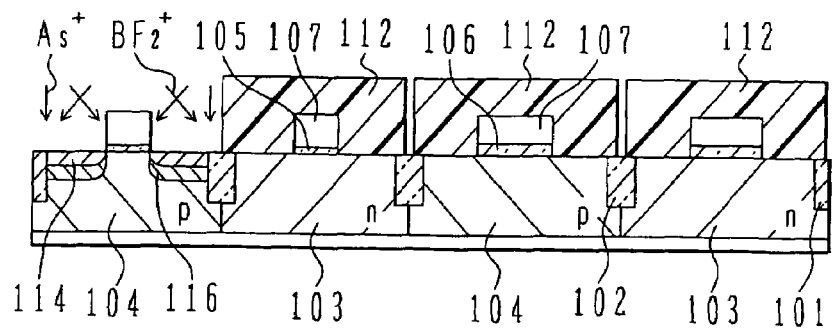
FIGS. 10A to 10D are cross sectional views of a semiconductor substrate illustrating a manufacture method for a plurality kind of transistors according to fundamental conventional technologies.
Figure 10B:
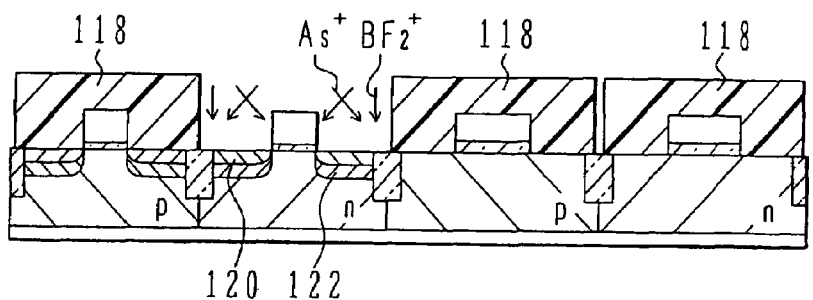
Figure 10C:
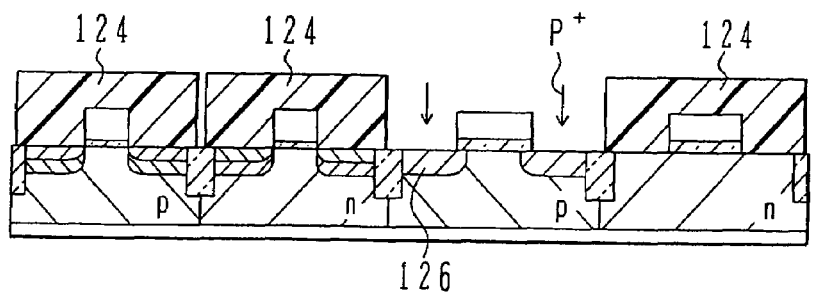
Figure 10D:
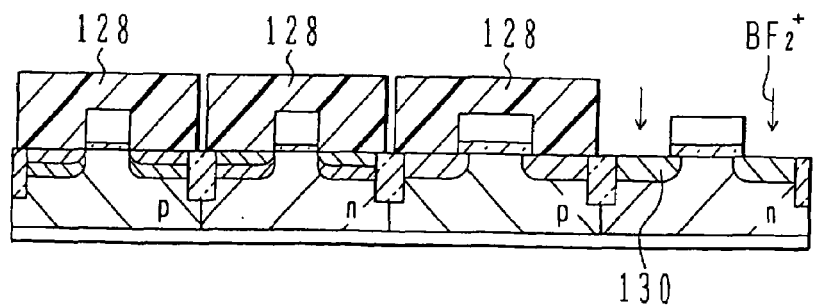

As shown in FIG. 9B, an insulating film of silicon oxide or the like is deposited on the whole substrate surface, and anisotropical etching is performed to form side wall spacers SW on the side walls of the gate electrode and remove the insulating film on a flat surface. In this state, n-type impurity ions are implanted along a vertical direction at a high concentration to form high concentration source/drain regions HDD.

In this manner, an n-channel MOS transistor excellent in a source/drain breakdown voltage is formed. If the conductivity type is reversed, a p-channel MOS transistor can be formed.

The present invention has been described in connection with the preferred embodiments. The invention is not limited only to the above embodiments. For example, the number of kinds of transistors to be mounted on a semiconductor integrated circuit can be increased or decreased depending upon use purposes. Various circuits to be formed can be selected.

The salicide block layer is not limited only to silicon oxide but it may be made of other insulating materials such as silicon nitride. Silicidation is not limited only to Co but other materials such as Ni may also be used. The salicidation process may be omitted. It will be apparent to those skilled in the art that other various modifications, improvements, combinations, and the like can be made.

The embodiments are applicable to semiconductor integrated circuits of various use mounting a plurality kind of semiconductor elements. For example, the embodiments are applicable to a semiconductor device mixing high precision resistors and ESD protection resistors with transistors.

The embodiments are applicable to a semiconductor integrated circuit having transistors operating at multiple voltages and to a semiconductor device having transistors requiring high breakdown voltages.

What we claim are:

1. A semiconductor device comprising:
a semiconductor substrate;
a first active region of a first conductivity type formed in said semiconductor substrate;
a second active region of a second conductivity type formed in said semiconductor substrate;
a first gate insulating film having a first thickness, and formed on said first active region;
a second gate insulating film having a second thickness thinner than the first thickness, and formed on said second active region;
first and second gate electrodes formed on the first and second gate insulating films, respectively;
side wall spacers of insulating material formed on side walls of said first and second gate electrodes;
a first diffusion region of the second conductivity type formed in said first active region outside and aligned with the edge of said side wall spacers;
a second diffusion region of the first conductivity type formed in said second active region outside and aligned with the edge of said side wall spacers;
a third diffusion region of the second conductivity type having an impurity concentration lower than that of said first diffusion region, and formed in said first active region outside and aligned with the edge of said first gate electrode;
a fourth diffusion region of the second conductivity type formed in said second active region outside and aligned with the edge of said second gate electrode, and having an impurity concentration higher than that of said second active region; and
a fifth diffusion region of the first conductivity type formed in said second active region and within said fourth diffusion region outside and aligned with the edge of said second gate electrode, and having an impurity concentration lower than that of said second diffusion region;
wherein said gate insulating films extend under said side wall spacers and do not extend outside the sidewall spacers, and the impurity concentration distributions of said third diffusion region is substantially equal to that of said fourth diffusion region.

2. The semiconductor device according to claim 1, wherein said third diffusion region of the second conductivity type has an impurity concentration gradient along a horizontal direction, in an area from under said first gate electrode, and via an end of said first gate electrode, to under said side wall spacers.

3. The semiconductor device according to claim 1, wherein the first thickness is five times or more the second thickness.

4. The semiconductor device according to claim 1, further comprising:

a third active region of the second conductivity type formed in said semiconductor substrate;

a fourth active region of the first conductivity type formed in said semiconductor substrate;

a third gate insulating film having the first thickness, and formed on said third active region;

a fourth gate insulating film having the second thickness, and formed on said fourth active region;

third and fourth gate electrodes formed on the third and fourth gate insulating films, respectively;

side wall spacers of insulating material formed on side walls of said third and fourth gate electrodes;

a sixth diffusion region of the first conductivity type formed in said third active region outside and aligned with the edge of said side wall spacers;

a seventh diffusion region of the second conductivity type formed in said fourth active region outside and aligned with the edge of said side wall spacers;

an eighth diffusion region of the first conductivity type having an impurity concentration lower than that of said sixth diffusion region, and formed in said third active region outside and aligned with the edge of said third gate electrode;

a ninth diffusion region of the first conductivity type formed in said fourth active region outside and aligned with the edge of said fourth gate electrode, and having an impurity concentration higher than said fourth active region; and a tenth diffusion region of the second conductivity type formed in said fourth active region outside and aligned with the edge of said fourth gate electrodes, wherein the impurity concentration distribution in said eighth diffusion region is substantially equal to that of said ninth diffusion region.

5. The semiconductor device according to claim 4, wherein said eighth diffusion region of the first conductivity type has an impurity concentration gradient along a horizontal direction, in an area from under said third gate electrode, via under an end of said third gate electrode, to under said side wall spacer.

* * * * *